United States Patent [19]

Leach

[11] Patent Number: 4,495,426
[45] Date of Patent: Jan. 22, 1985

[54] LOW POWER INVERTER CIRCUIT
[75] Inventor: Jerald G. Leach, Houston, Tex.
[73] Assignee: Texas Instruments Incorporated, Dallas, Tex.
[21] Appl. No.: 335,028
[22] Filed: Dec. 24, 1981
[51] Int. Cl.³ .................. H03K 19/096; H03K 19/20; H03K 17/693
[52] U.S. Cl. .................................. 307/453; 307/443; 307/481; 307/583; 307/269
[58] Field of Search .............. 307/443, 452, 453, 481, 307/482, 578, 582, 583, 264, 269

[56] References Cited
U.S. PATENT DOCUMENTS

| | | | |
|---|---|---|---|
| 3,567,968 | 3/1971 | Booher | 307/481 X |
| 3,631,261 | 12/1971 | Heimbigner | 307/481 X |
| 3,644,750 | 2/1972 | Campbell | 307/481 |
| 4,316,106 | 2/1982 | Young et al. | 307/443 X |

Primary Examiner—Stanley D. Miller
Assistant Examiner—David R. Hudspeth
Attorney, Agent, or Firm—Thomas E. Tyson; Leo N. Heiting; Melvin Sharp

[57] ABSTRACT

A circuit that precharges a node and conditionally discharges the node according to the value of an input. This circuit also includes a device to isolate the node from the output line during precharge. This circuit can be fabricated as a positive channel metal oxide field effect transistor and can be structured to perform the logic function of an inverter or an NAND or NOR gate in simple form. This circuit also includes a capacitor that is connected to the precharge node such that additional charge provided by the clocking circuit is used to add charge to the node such that the charge at the node is greater than the charge provided by the circuit power supply alone.

5 Claims, 8 Drawing Figures

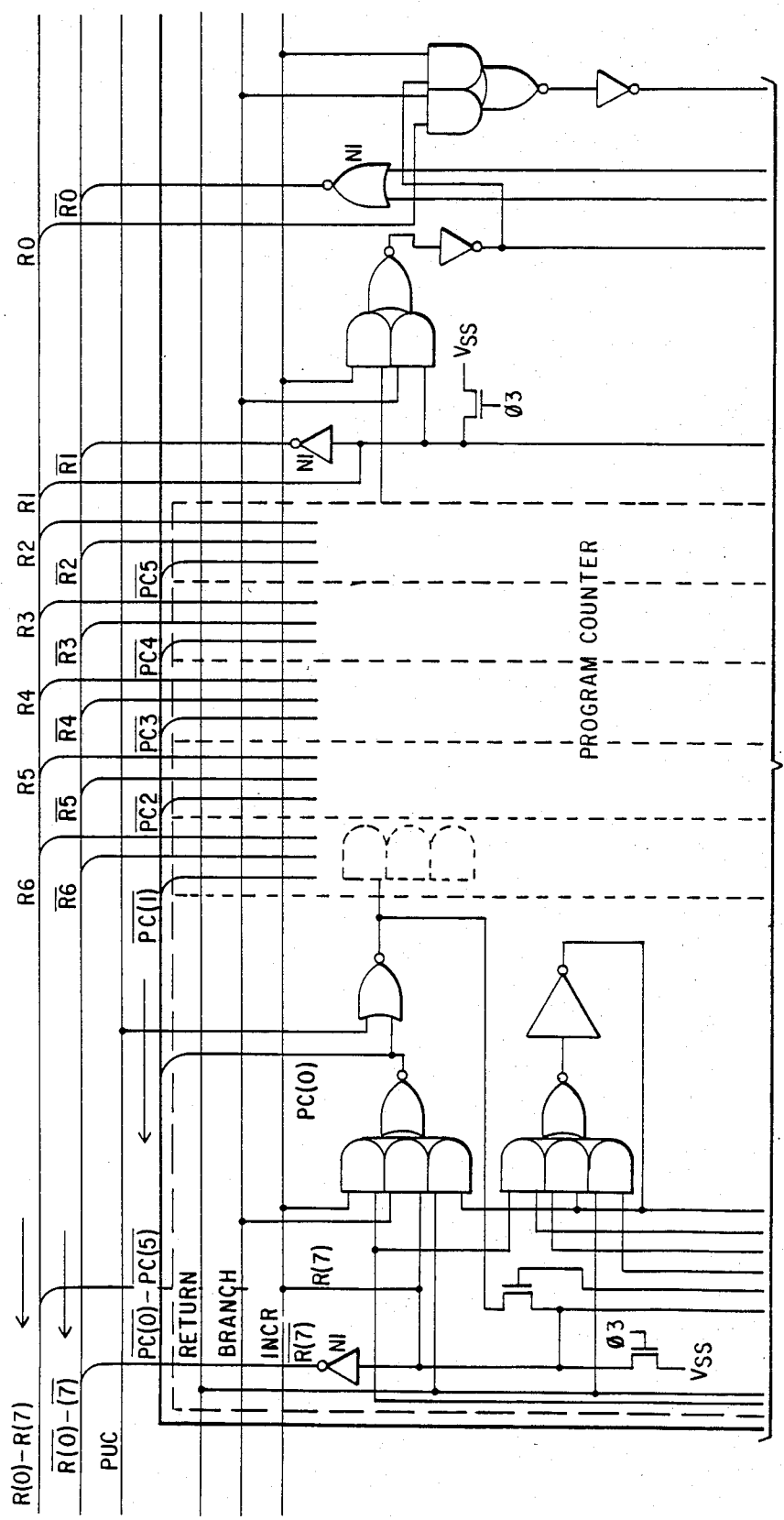

LOW POWER INVERTER CIRCUIT

RELATED APPLICATIONS

U.S. patent applications that are related to the present application include U.S. patent Ser. No. 335,029 entitled, "Low Voltage Display Circuit", U.S. patent appication Ser. No. 334,852 entitled, "Low Voltage RAM Cell", U.S. patent application Ser. No. 334,486 entitled, "Low Power Clock Generator Circuit", U.S. patent application Ser. No. 334,487 entitled "Low Power Oscillator Circuit", and U.S. patent application Ser. No. 334,850 entitled "Integrated On/Off Switch".

BACKGROUND

1. Field of the Invention

This invention relates to digital processing circuitry and more particularly to low power circuits for digital processing.

2. Prior Art

Electronic calculator systems of the type having all the main electronic functions within a single, large scaled integrated (LSI) semiconductor chip or small numbers of chips are described in the following prior applications or patents assigned to Texas Instruments Incorporated:

U.S. Pat. No. 3,819,921 by Kilby et al for "Miniature Electronic Calculator", based on an application orginally filed Sept. 29, 1967;

U.S. Pat. No. 4,074,351 by Boone and Cochran for "Variable Function Program Calculator";

U.S. Pat. No. 3,819,957 by Bryant for "Digital Mask Logic in Electronic Calculator Chip"; and U.S. Pat. No. 3,987,416 by Vandierendonct, Fischer and Hartsell for "Electronic Calculator With Display and Keyboard Scanning".

These prior inventions made possible vast reductions in cost and size and increases in functions of electronic calculators. Many millions of such calculators have been produced. The efforts to reduce manufacturing costs and increase the functions available to the user are continuing. Particularly it is desired to provide a basic chip structure that is quite versatile and can be used for many different types of calculators and similar digital processing equipment. This permits a single manufacturing facility to produce a lare quantity of the same devices, differing only in a single mask change, to produce a dozen variations while still maintaining large volume cost advantages.

The previous MOS/LSI calculator chips as referred above were generally register organized in that a single instruction word operated on all of the digits in a given register. A more versatile approach is to make the machine digit organized, operating on one digit at a time. For example, it may be desired to test or set a particular one bit flag. In a register machine, an entire 13 digit register must be addressed and mask to implement this, whereas a digit organized machine may access only the needed digit or bit. An example of such a processing chip is disclosed in U.S. Pat. No. 3,991,305 by Caudel et al entitled, "Electronic Calculator or Digital Processor Chip with Multiple Code Combinations of Display and Keyboard Scan Outputs". This patent discloses what is commonly known in industry as the TMS 1000 architecture for a 4 bit microcomputer. Another approach using this same type of architecture is disclosed in U.S. patent application Ser. No. 216,113 entitled, "Dual Register Digital Processor System" by Koeppen, Rogers, Solimeno and Brown. The architecture of disclosed herein is similar to these TMS 1000 architecture and the architecture disclosed in the above applications implemented with low power circuitry.

FIG. 1A illustrates the prior art attempt at low power operation using positive channel MOS field effect transistor devices. This type of circuit is referred to as precharge and conditional discharge circuitry. The node 800 becomes charged during Phi 3. It should be noted that since the circuitry is presented in P-MOS, the devices are active during the negative portions of the timing signals. This node remains charged until conditionally discharged by the input line during Phi 1. If the input line remains high, then the node will remain charged and the output will remain a −V as shown in FIG. 1B. However, if the input is low thus activating device 801, the node 800 will be discharged during phi 1 as shown. The disadvantage to this standard precharge discharge logic is that the precharge period can cause problems in other circuits, such as in addressing RAM cells. If precharge discharge logic was connected directly in the addressing portion of the RAM cell, all the addresses would be ON during the precharge time. Therefore if precharge discharge logic is to be used to address a RAM additional circuitry would be required to buffer the precharge intervals from the addressing lines of the RAM cells.

FIG. 2 illustrates a static inverter which includes a device with the depleted region 802 to provide charge at the node connected to the output line. The static inverter removes the precharge problem, however, the static inverter also consumes a larger amount of d.c. current. A static inverter also requires that the size of the load device to be much larger than any of the devices in the precharge discharge circuitry. This is a disadvantage when fabricating the circuitry on a small silicon chip.

A third approach to the low power circuit operation is shown in FIG. 3, which is a complementary MOS inverter. The clocked CMOS inverter does not have precharges and does not require constant d.c. current. However, the CMOS fabrication process is more expensive and more complex than a normal PMOS or NMOS fabrication process.

The low power approach to many semiconductor display applications has included the use of CMOS, precharge/discharge and static devices. Once such application is circuitry required for liquid crystal displays. Liquid crystal displays require low amounts of power and thus interface well with low power processing circuitry. A reference for liquid crystal display requirements is the *International Handbook of Liquid Crystal Displays* 1975–76, Second Edition, with 1976 Supplement by Martin Tobias, published Ovum Ltd. 14 Pen Road, London, NC 9RD, England. Another reference is "General Information on Liquid Crystal Display", published by Epson America, Incorporated, 2990 West Lomita Boulevard, Tolerance, Calif. A third reference is an article entitled, "Liquid Crystal Displays" by L. A. Goodman, printed in the *Journal of Vacuum Science and Technology*, Vol. 10, No. 5, Sept/Oct. 1973.

In the past, the LCD devices have required the use of low power circuitry such as the precharge discharge logic, or CMOS logic. This specification discloses another alternative, low power circuit that makes possible a low power interface to LCD's without the disadvantages of the two prior art circuits.

This specification also discloses a low voltage RAM cell. RAM cells are included in the prior named patents. However, this specification describes a technique to fabricate a low voltage RAM cell.

Other patents including similar techniques are U.S. Pat. No. 4,061,506 entitled "Correcting Doping Defects" by McElroy and U.S. Pat. No. 4,280,271 entitled "Three Level Interconnect Process for Manufacture of Integrated Circuit Devices" by Lou, Ponder and Tubbs.

In past calculators and microcomputer chips, low power CMOS circuitry or static logic have been used to fabricate oscillators in clock circuitry. This specification discloses a technique to fabricate low power oscillator circuitry and clock circuitry without the disadvantage of precharge discharge circuitry, static converters and CMOS circuitry.

Also included in this specification is a description of an integrated circuit ON/OFF switch. The prior art for ON/OFF switches includes the mechanical ON/OFF switch which requires a separate switch dedicated to power switching. The advantage of an integrated ON/OFF switch is that the integrated ON/OFF switch is included in the keyboard and can also be used for other functions. Except for CMOS ON/OFF switches, prior ON/OFF switches have required a constant current flow of a significant degree thus reducing battery life of battery operated microcomputer systems. The disclosed integrated ON/OFF switch requires an insignificant amount of power while in the OFF state without CMOS fabrication.

SUMMARY OF THE INVENTION

A circuit is disclosed for low power operation. The circuit includes a device to precharge a node and second set of devices to discharge the node upon the occurrence of a selected input. In addition, other devices are provided to isolate the node from the output during the precharge time.

In a specific embodiment, the circuits consist of two parallel branches of series MOSFET devices. The first branch consists of three MOSFET devices in series. The first MOSFET device is triggered by a first clock and is connected to a node for precharging. Also connected to this node is a second device. A capacitor is connected between the gate of the second device and the precharge node. The third device in series with the second device receives its triggering signal from the input line. The second branch consists of four series devices. The first device is triggered by the precharged node. The second and third device are triggered by a second clock signal. The first output for the circuit is connected between the second and third device of the second branch. The fourth device is in series with the third device and the second output for the circuit is connected between the fourth device and the third device. In operation, the two clock signals are received in the first branch. The first clock signal provides a precharge to the node. During this time, the second clock signal is off, thus isolating the remainder of the circuitry from the precharge node. During the second clock phase, the node receives additional charge from the capacitor. If the input triggers the third device of the first branch, the node is discharged during the second clock cycle. Therefore, the first device of the second branch will remain closed and the output of the circuit will be grounded. If the input does not trigger the third device in the first branch, the charge on the node will trigger the first device on the second branch during the second clock cycle causing both outputs to be at the circuit voltage supply level.

DETAILED DESCRIPTION OF THE INVENTION

Figures 1A, 1B:
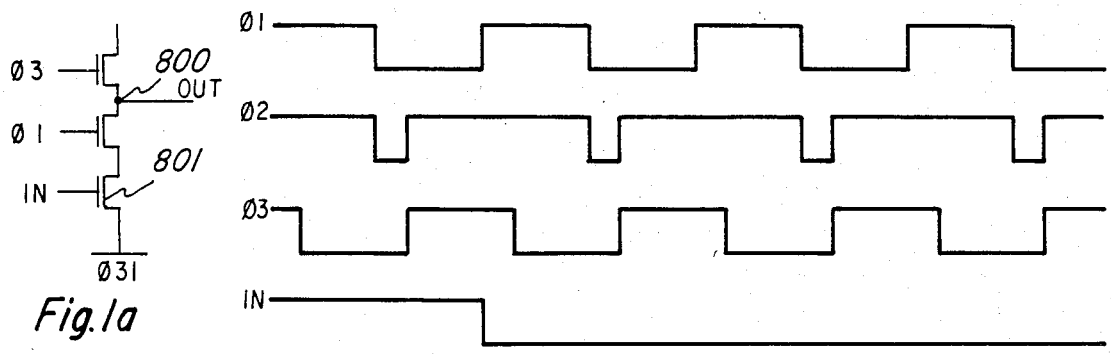
FIG. 1A is a schematic diagram of precharge/discharge logic.
FIG. 1B is a timing diagram for precharge/discharge logic.
Figure 2:
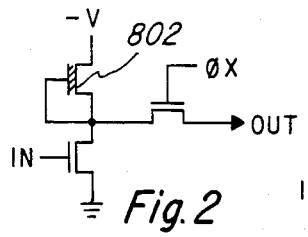
FIG. 2 is a schematic diagram of a static inverter.
Figure 3:
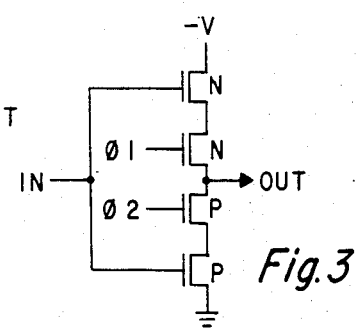
FIG. 3 is a schematic diagram of a complementary MOS inverter.
Figures 4A, 4B, 4C:
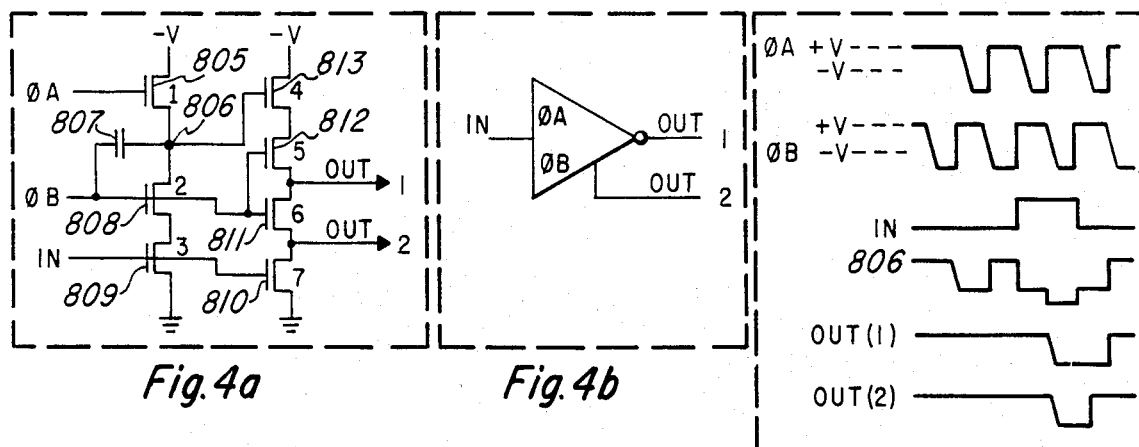
FIG. 4A is a schematic diagram of a low power MOS inverter.
FIG. 4B is a symbolic diagram of the low power MOS circuit shown in FIG. 4A.
FIG. 4C is a timing diagram of the low power MOS circuit in FIG. 4A.

FIG. 4A is the schematic drawing of the basic low power inverter. The symbol for this circuitry in FIG. 4A is shown in FIG. 4B. Timing diagrams for this circuitry is shown in FIG. 4C. Referring to FIG. 4A, the node 806 is charged during the time frame phi A by device 805. During phi B, the node 806 is discharged by the input line and device 809 if the input is low for PMOS circuitry. If, however, the input is high, then the timing signal phi B provides an additional charge through capacitor 807 to node 806. Node 806 turns on device 813 if charged and phi B likewise turns on devices 811 and 812. If the input is high thus not turning on device 810, the lines marked "out 1" and "out 2" produce an output voltage of −V as shown. It should also be noted that node 806 produces a voltage that is below −V since node 806 receives charge from −V or the negative rail, plus charge from the clocking phase phi B through capacitor 807. Therefore the voltage at node 806 is greater than −V as shown in FIG. 4A. This type of circuitry results in a low power inverter without the use of precharge/discharge logic or static inverters. In addition, all the devices shown in FIG. 4A may be fabricated in a PMOS structure as small devices.

Figure 5:
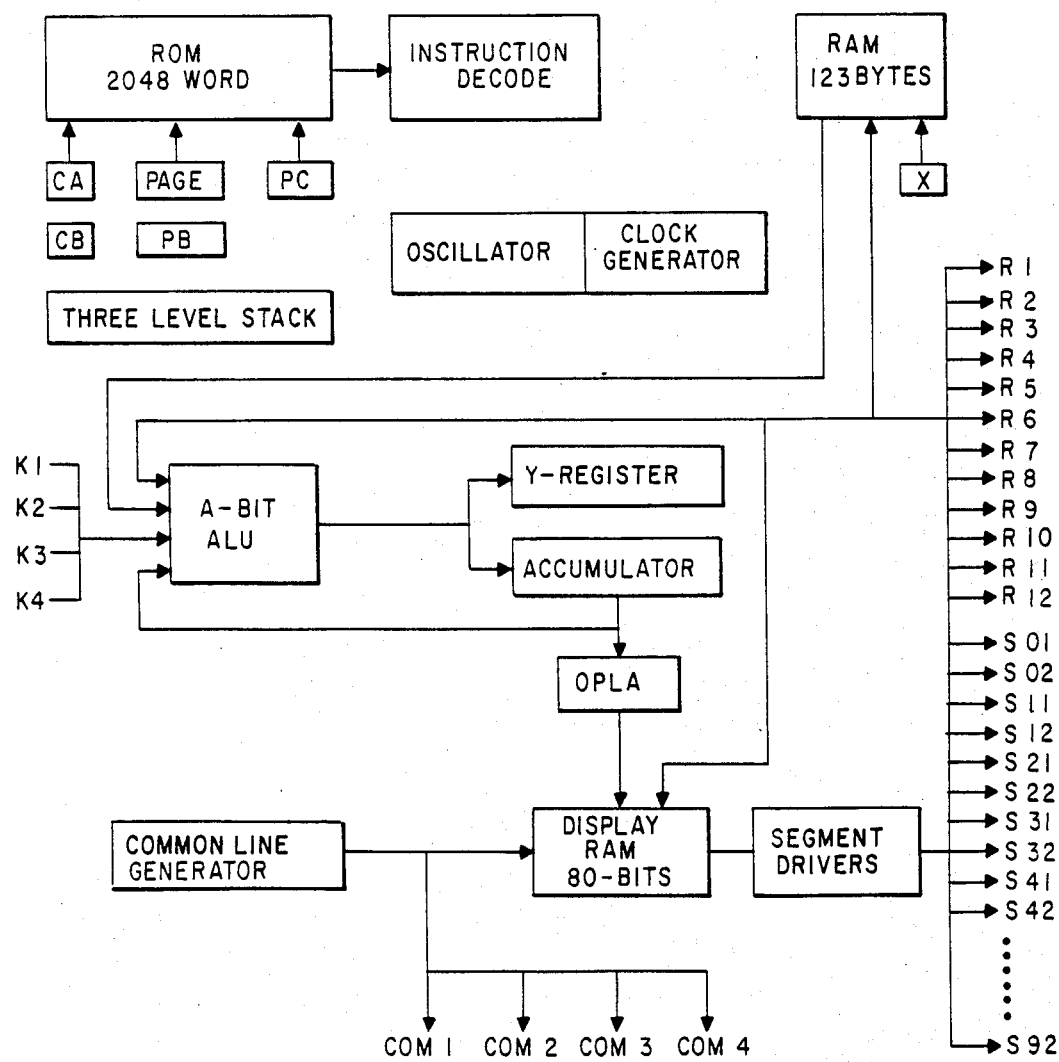
FIG. 5 is a block diagram of a microcomputer using low power MOS circuitry.
Figure 6A:
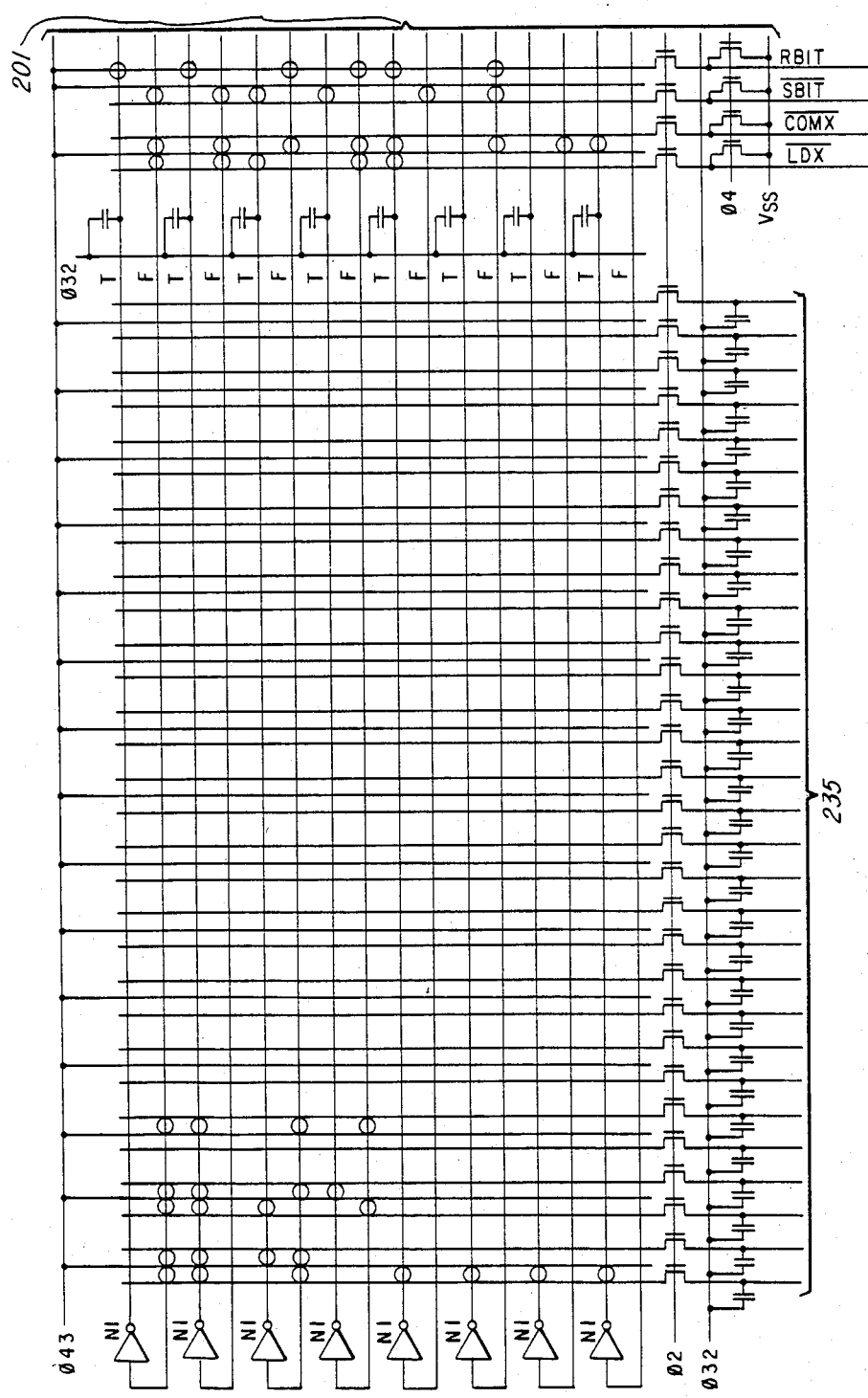
Figure 6B:
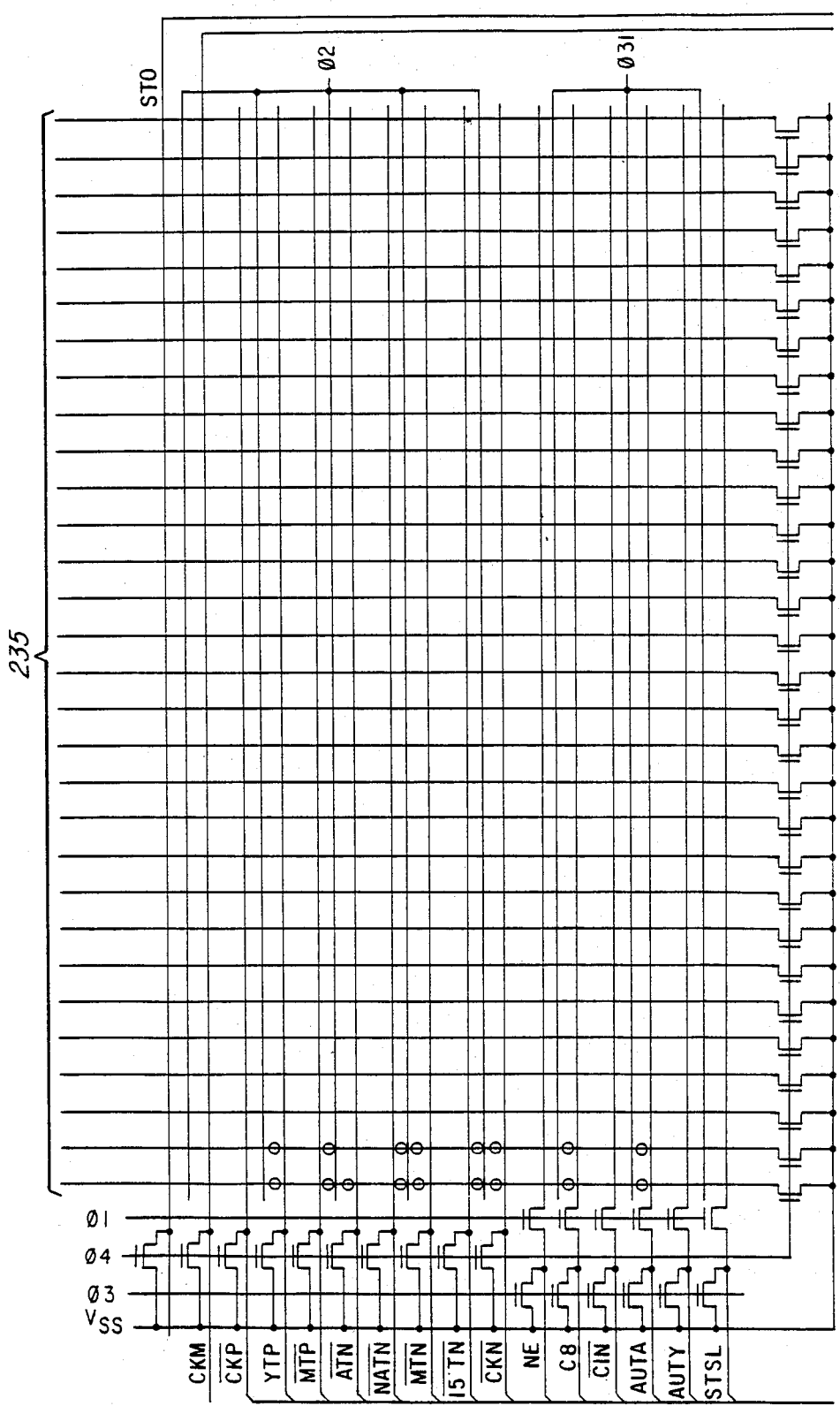
Figure 6C:
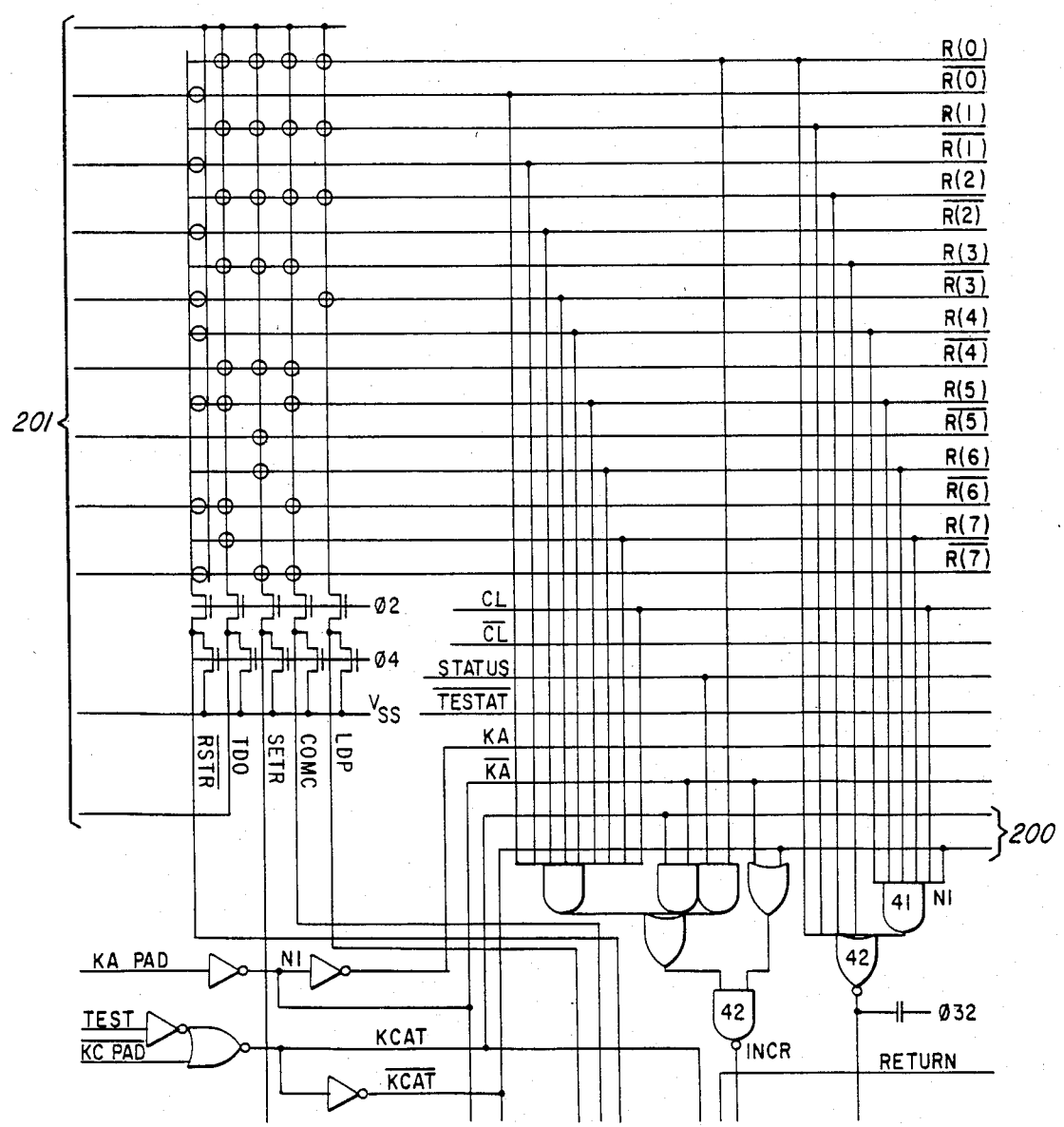
Figure 6D:
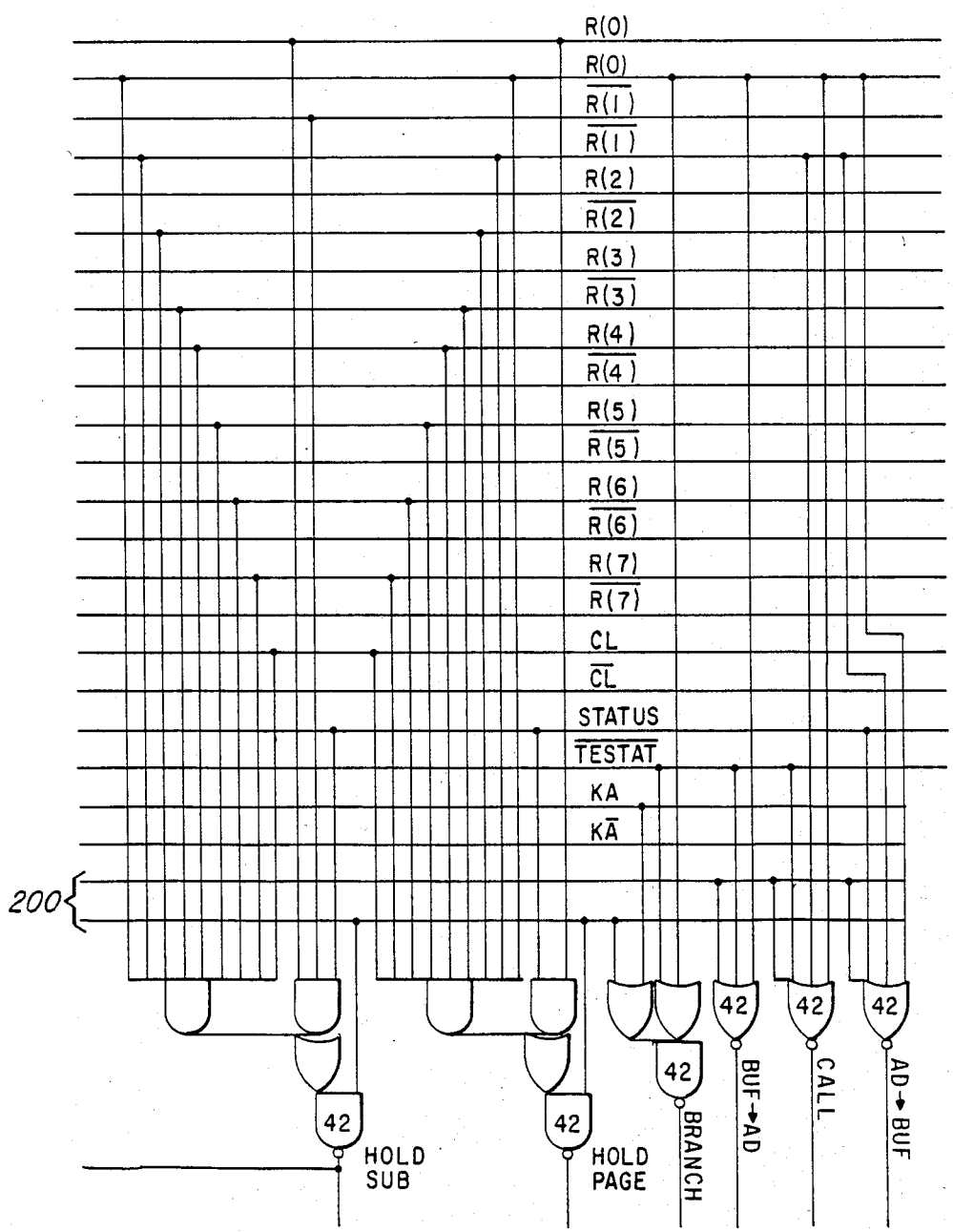
Figure 7:
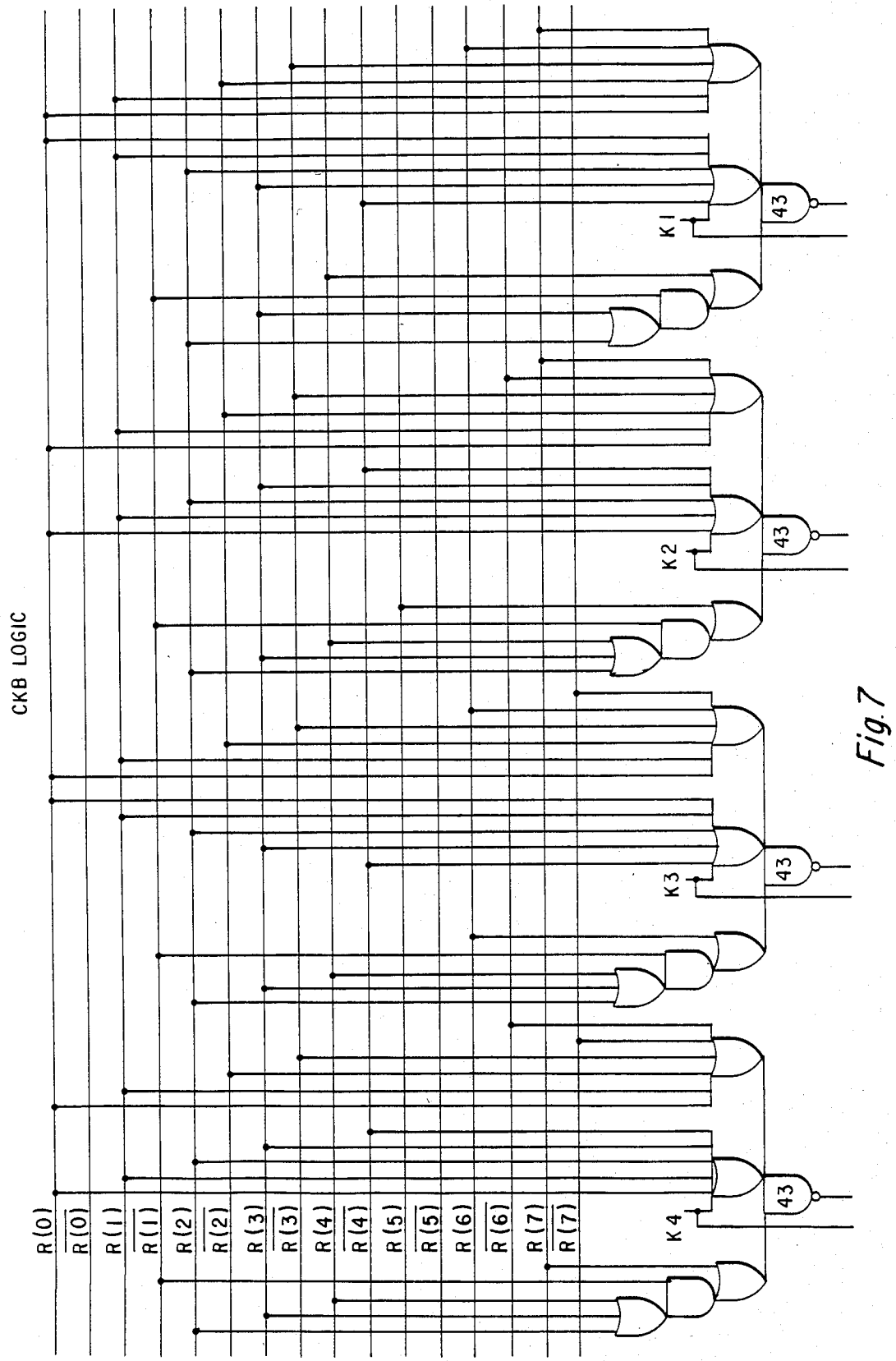
Figure 8A:
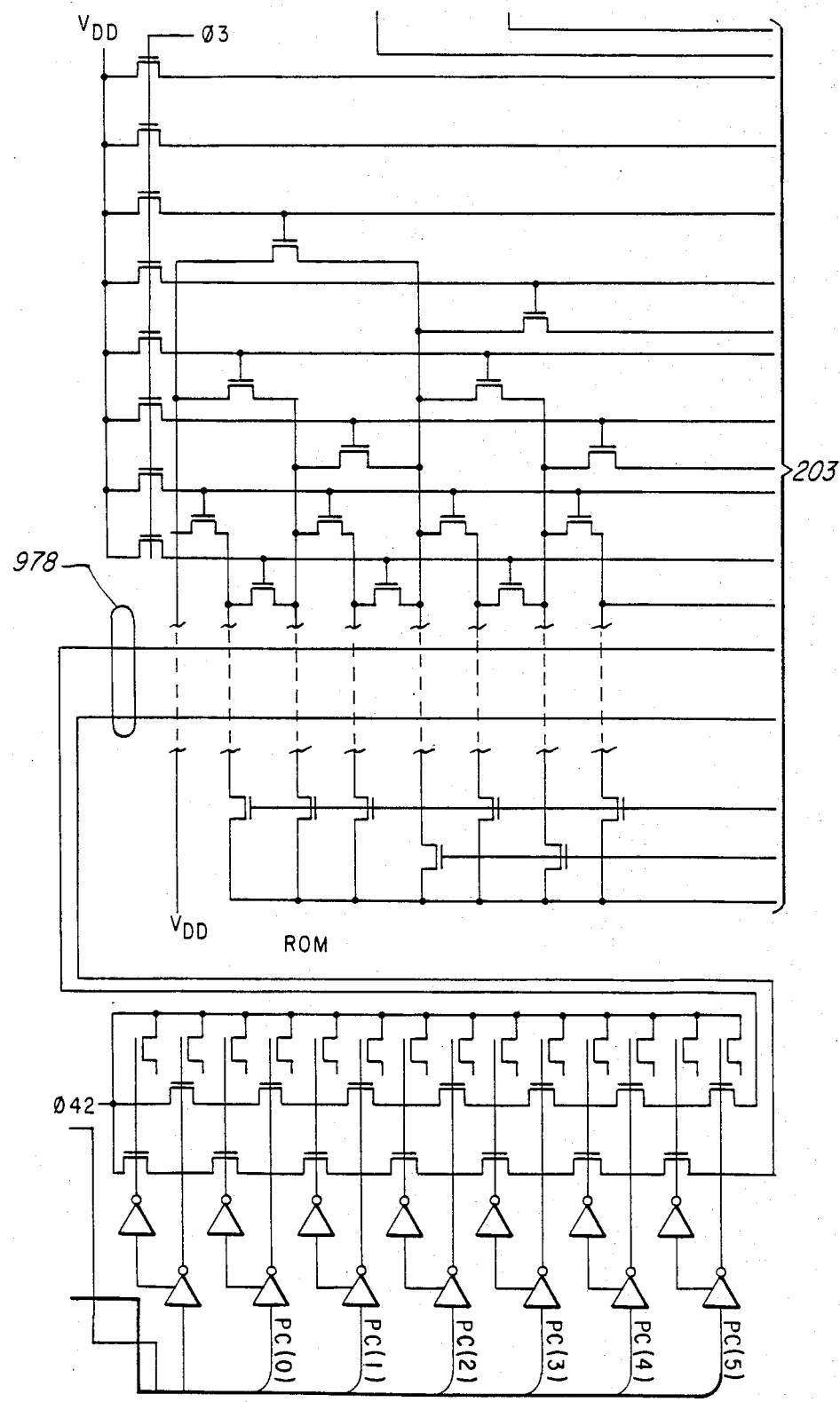
Figure 8B:
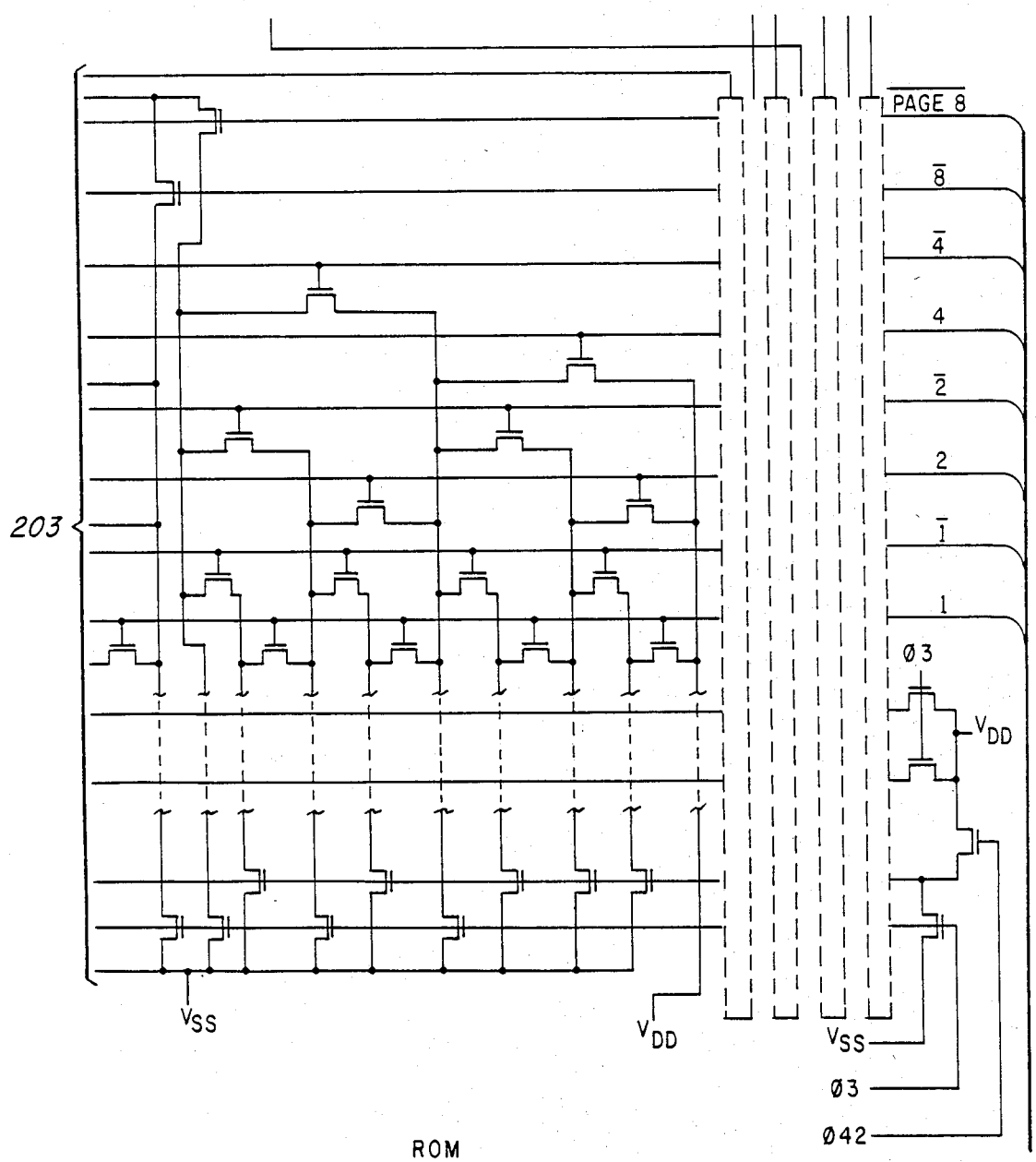
Figure 9B:
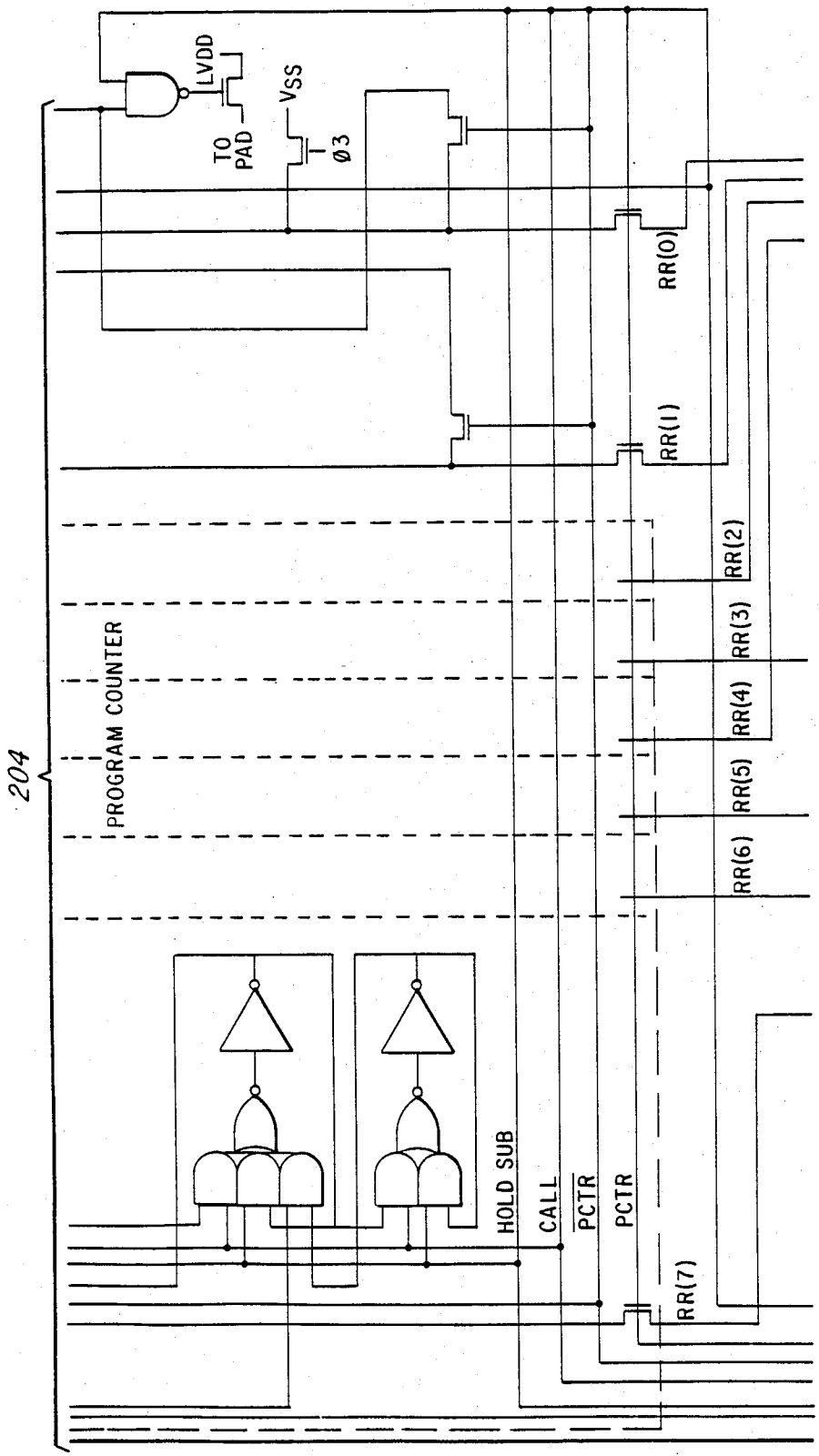
Figure 10A:
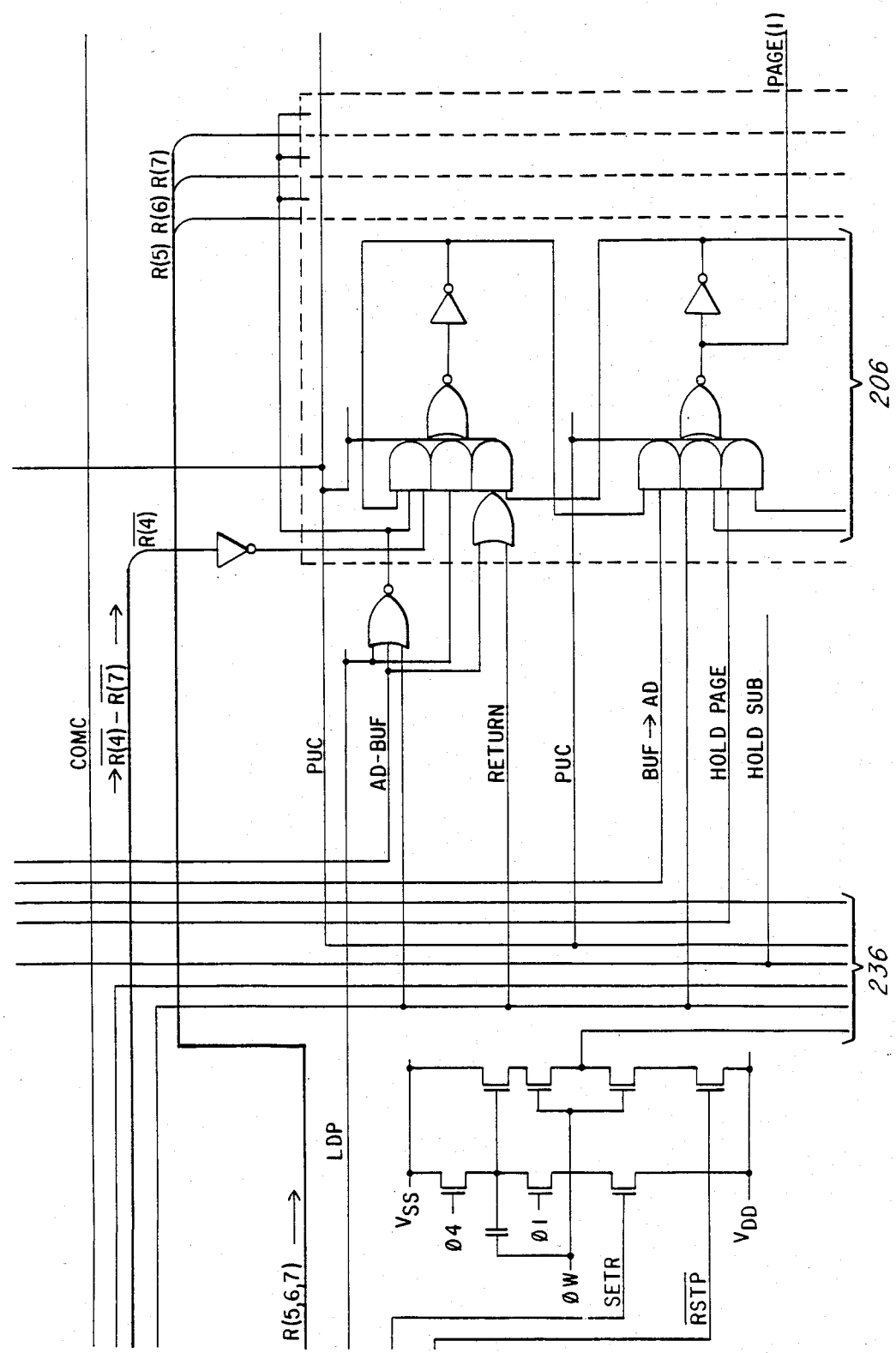
Figure 10B:
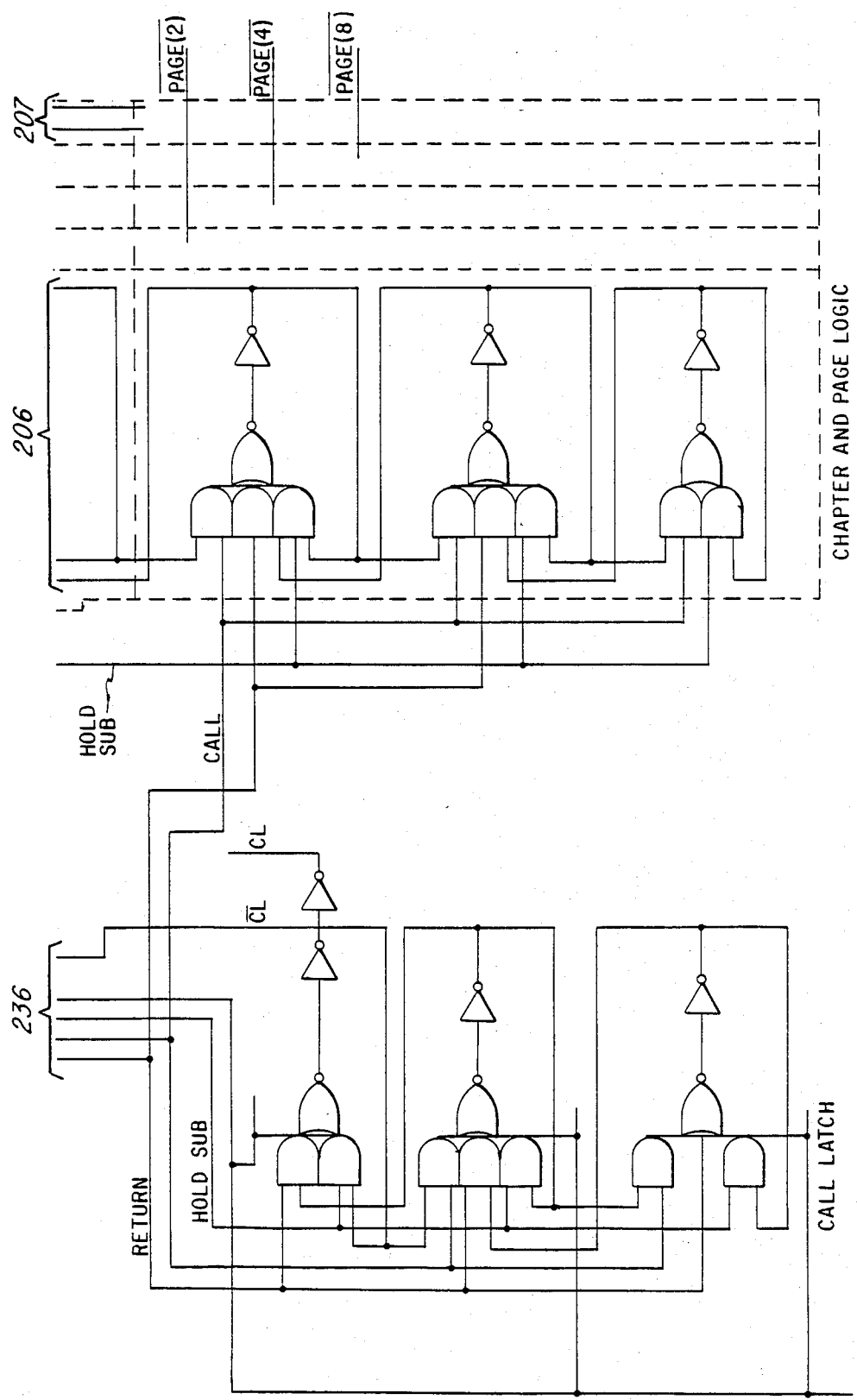
Figure 10C:
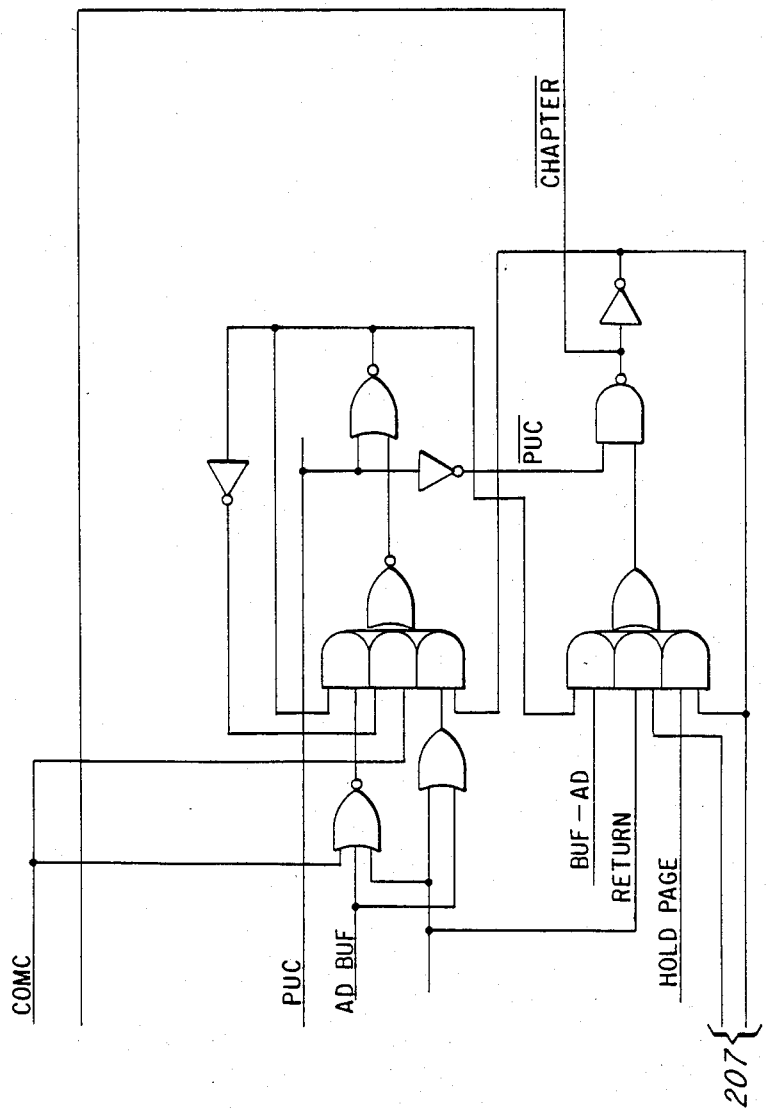
Figure 10D:
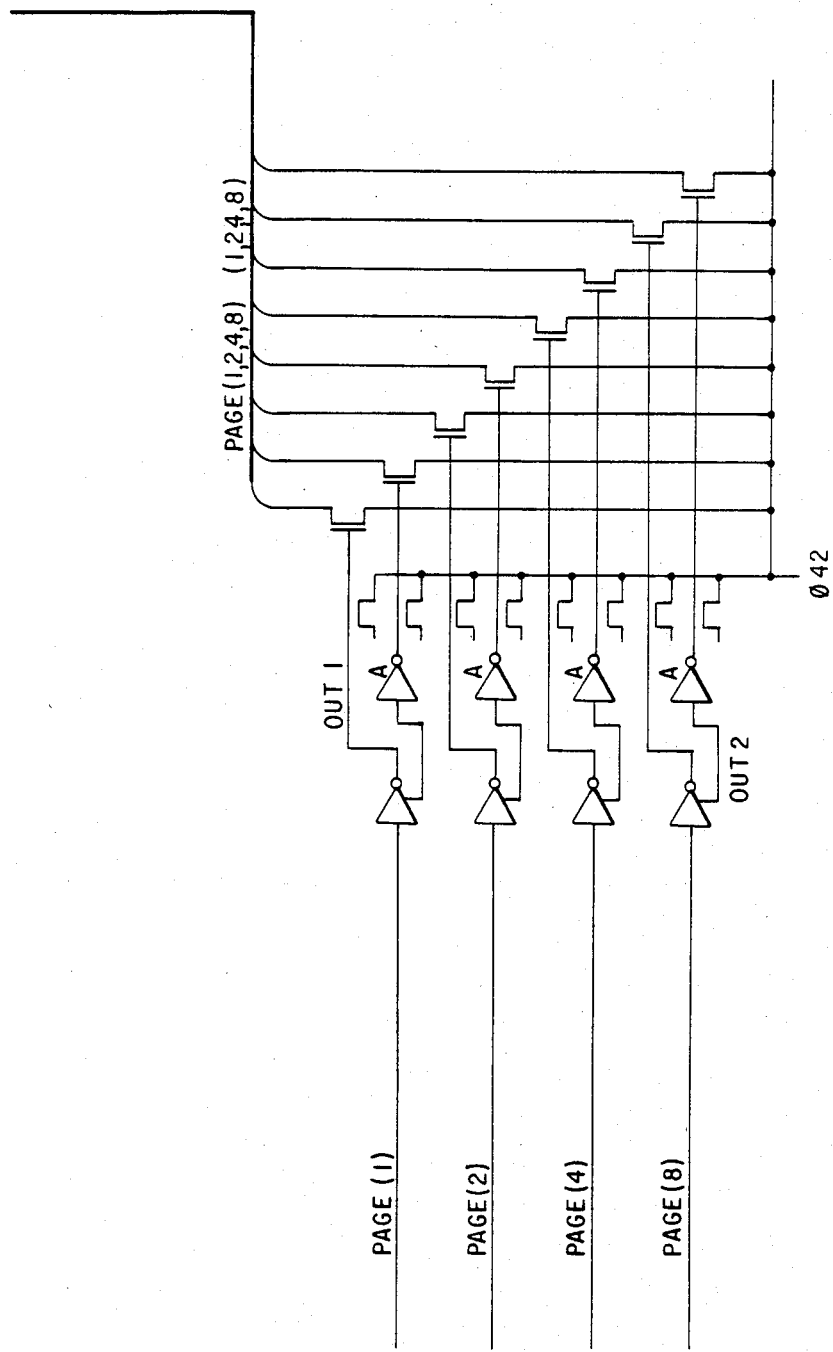
Figure 11A:
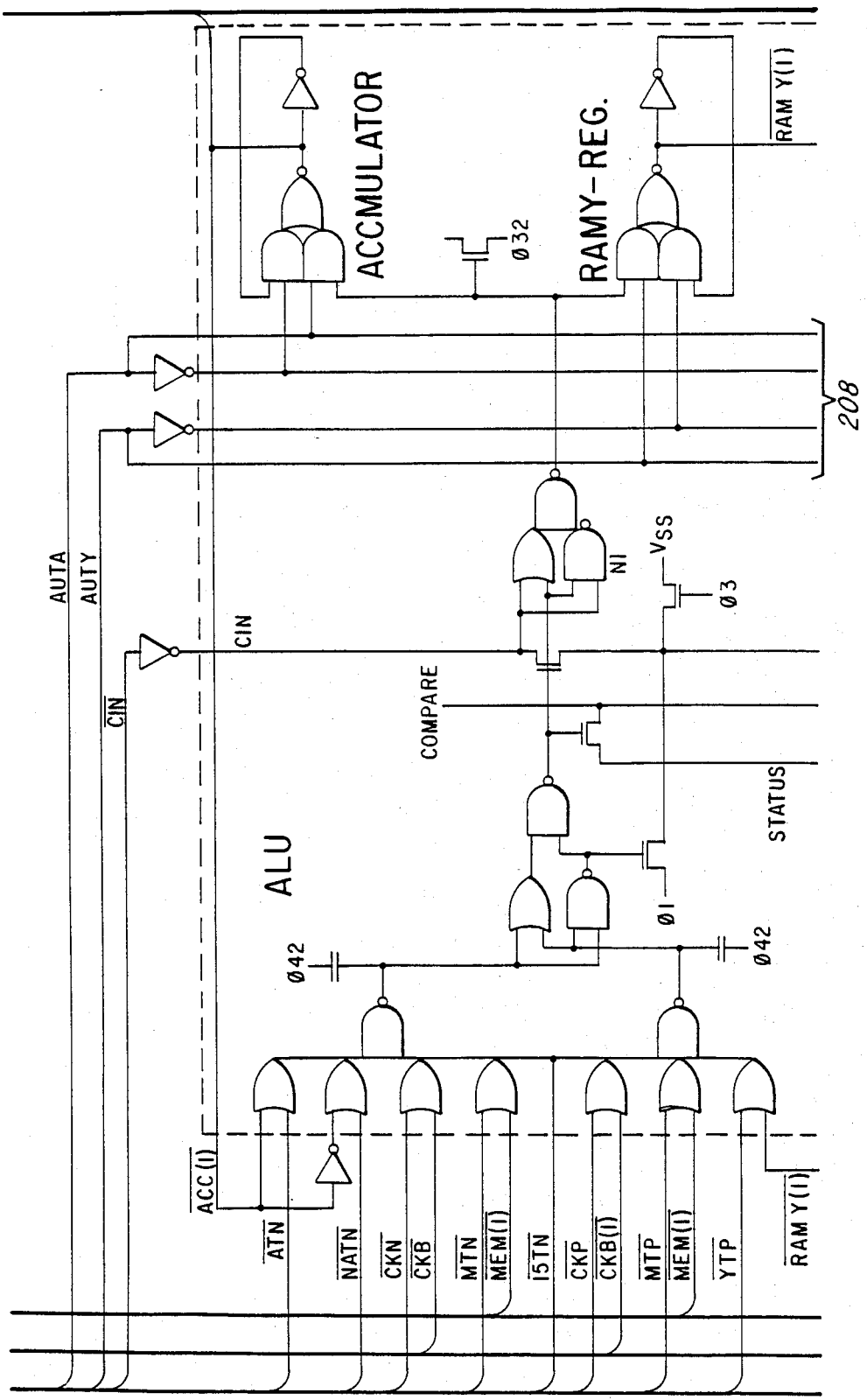
Figure 11B:
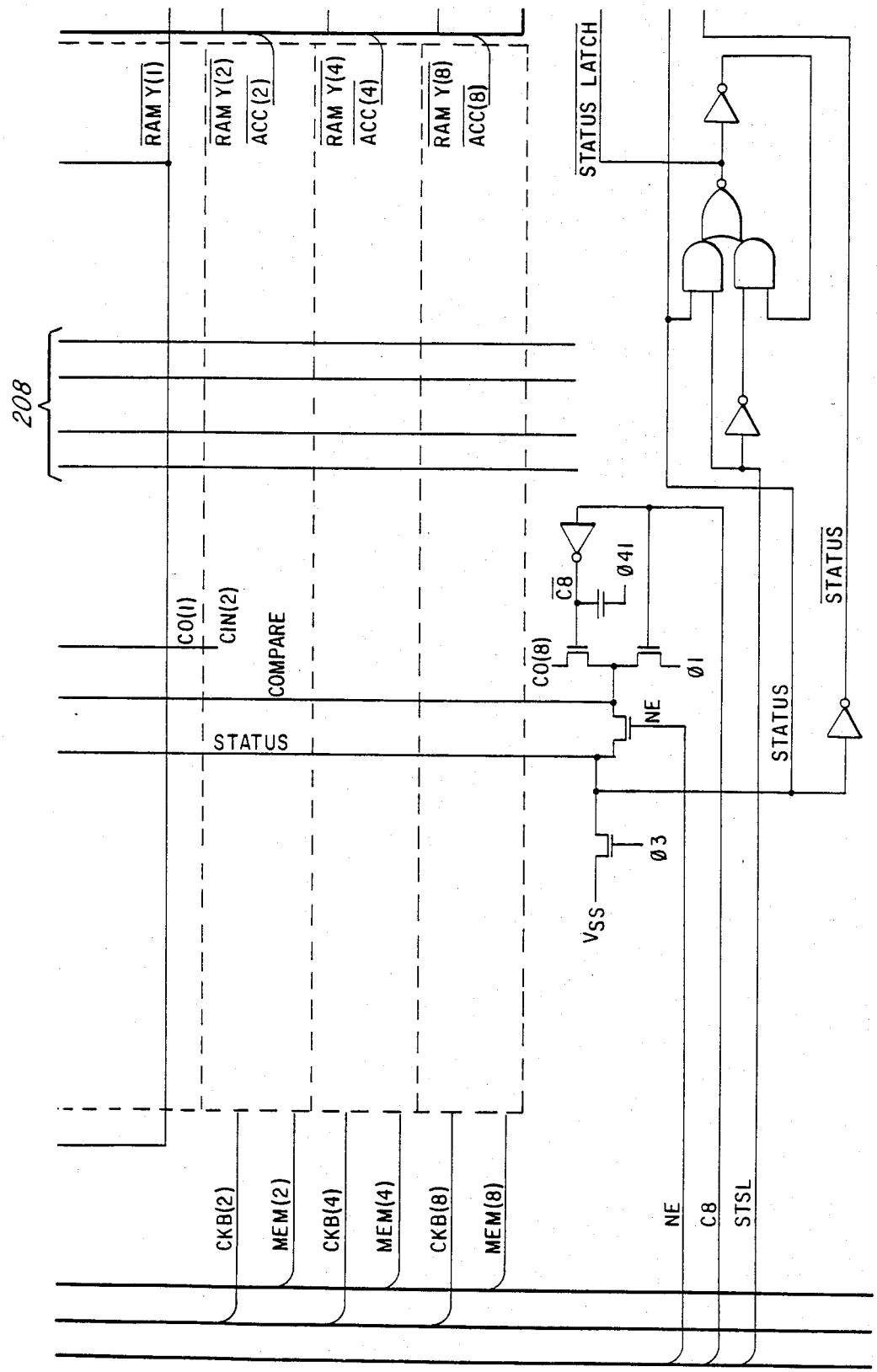
Figure 12:
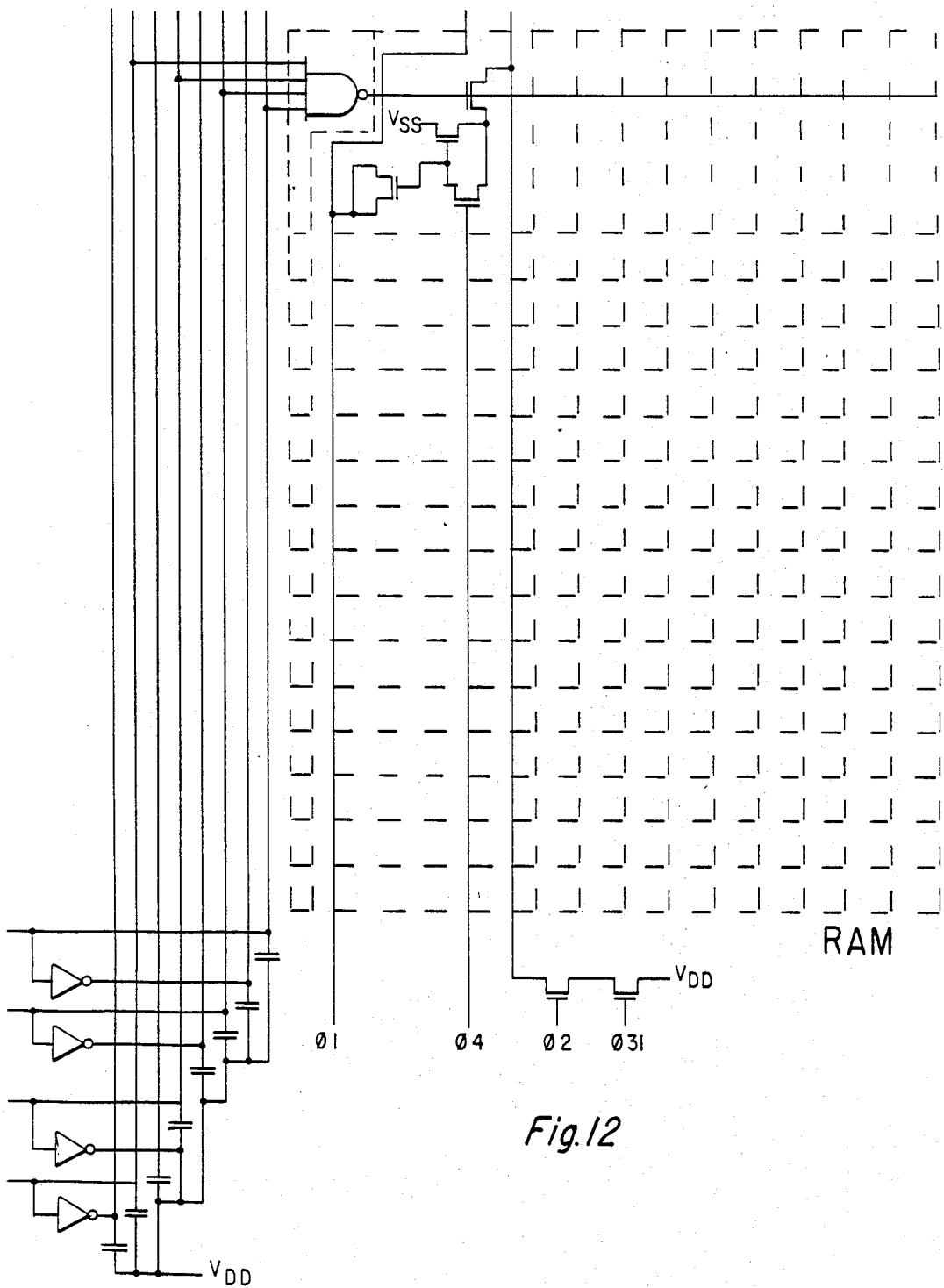
Figure 13:
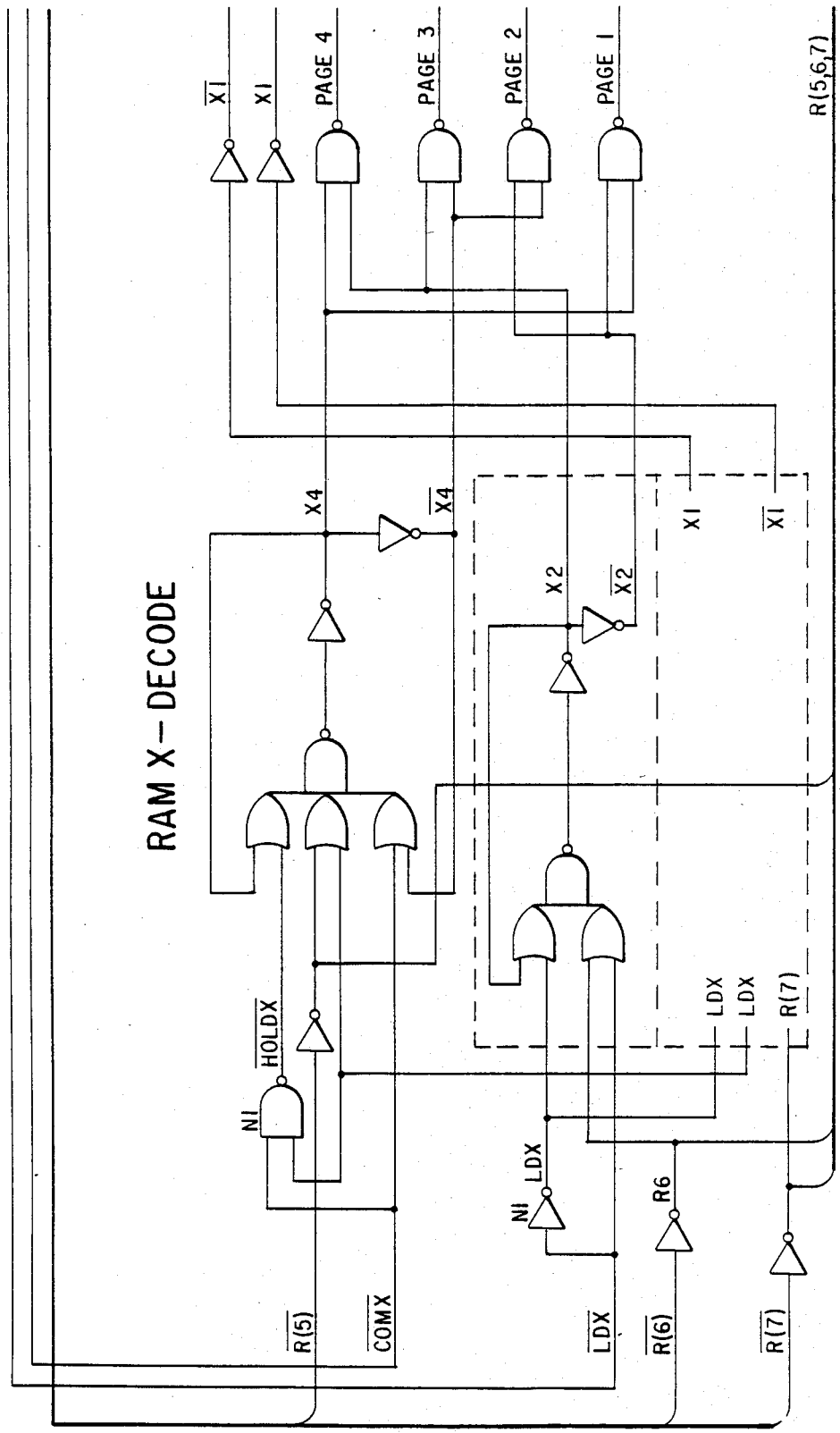
Figure 14A:
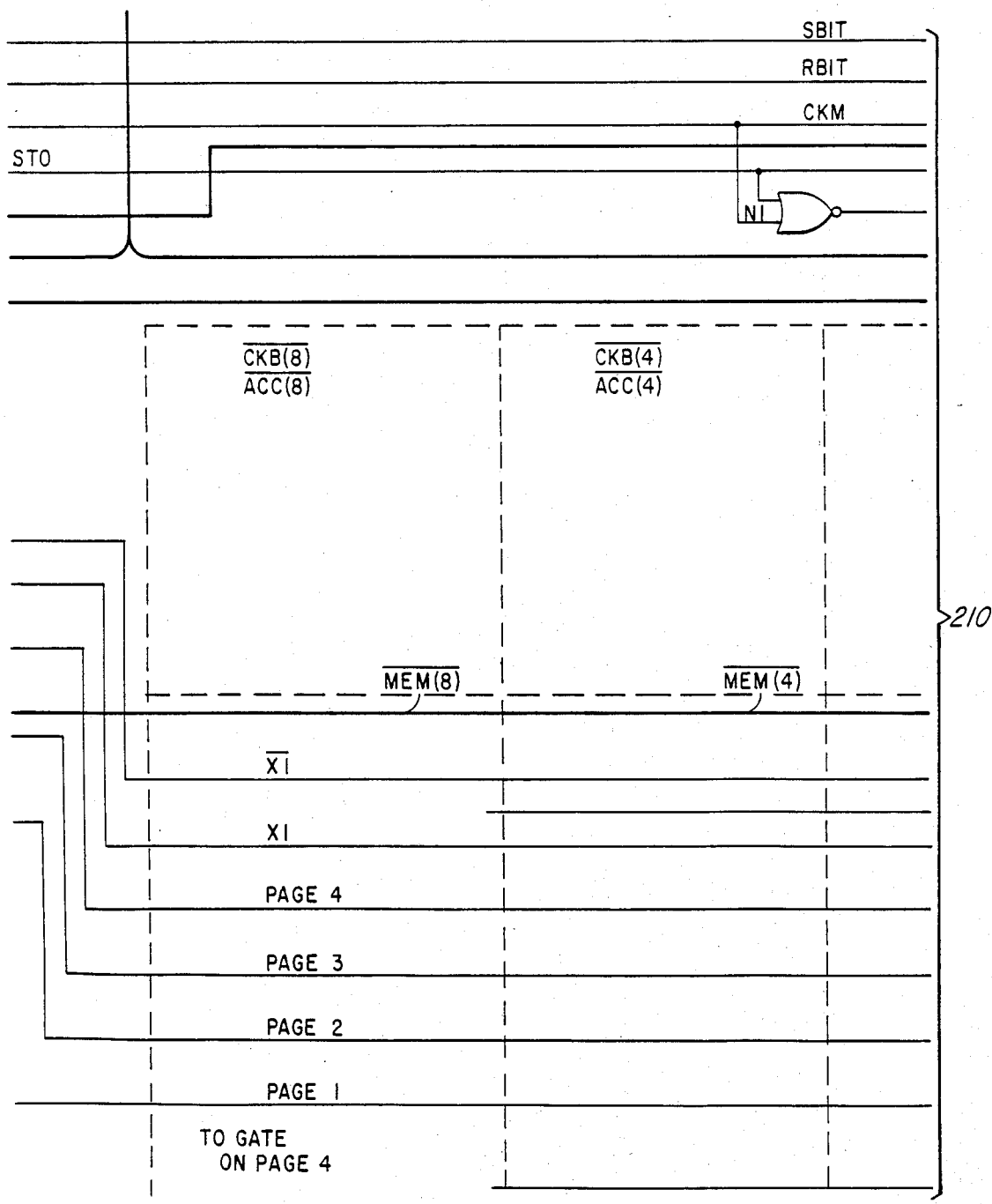
Figure 14B:
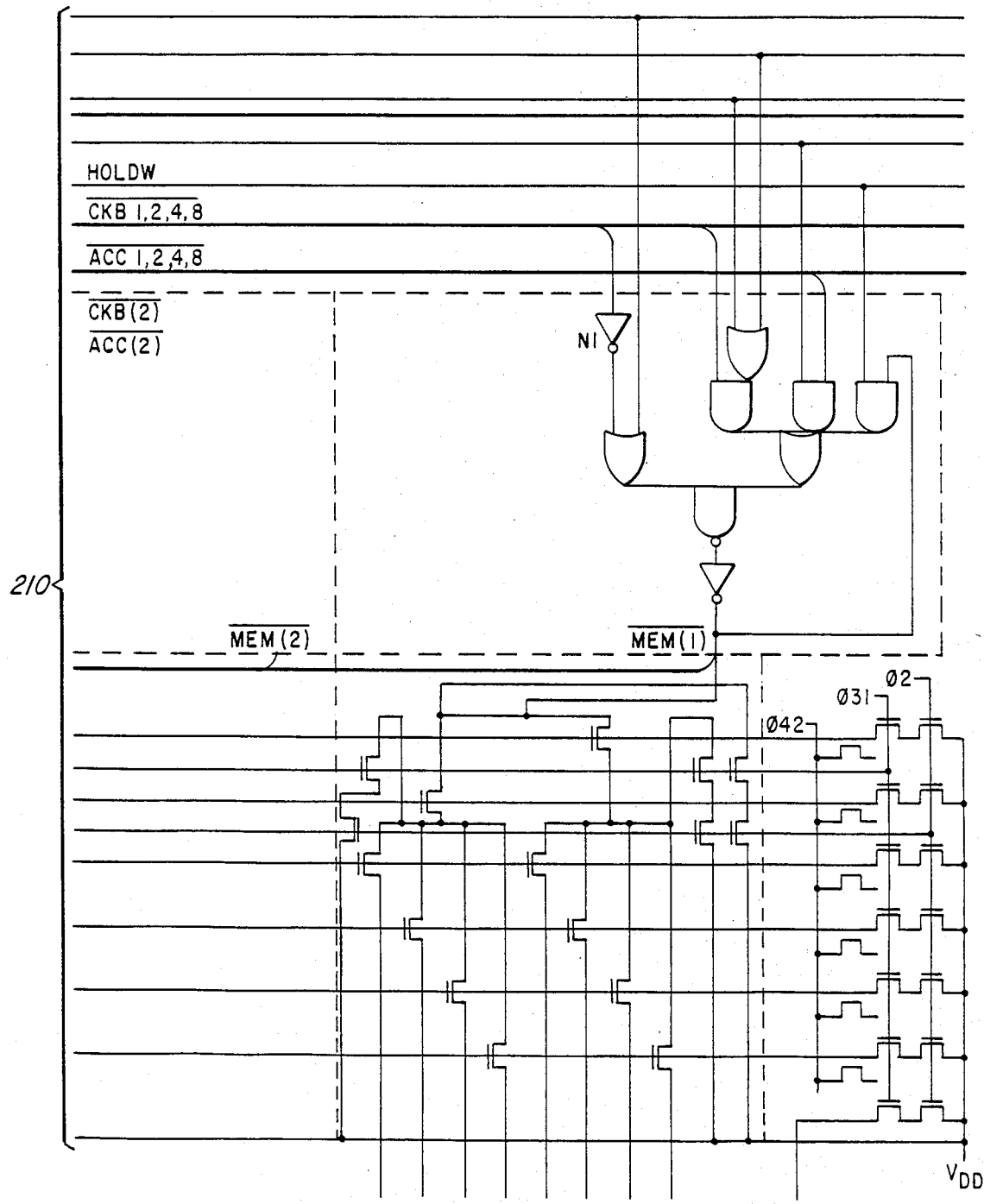
Figure 15:
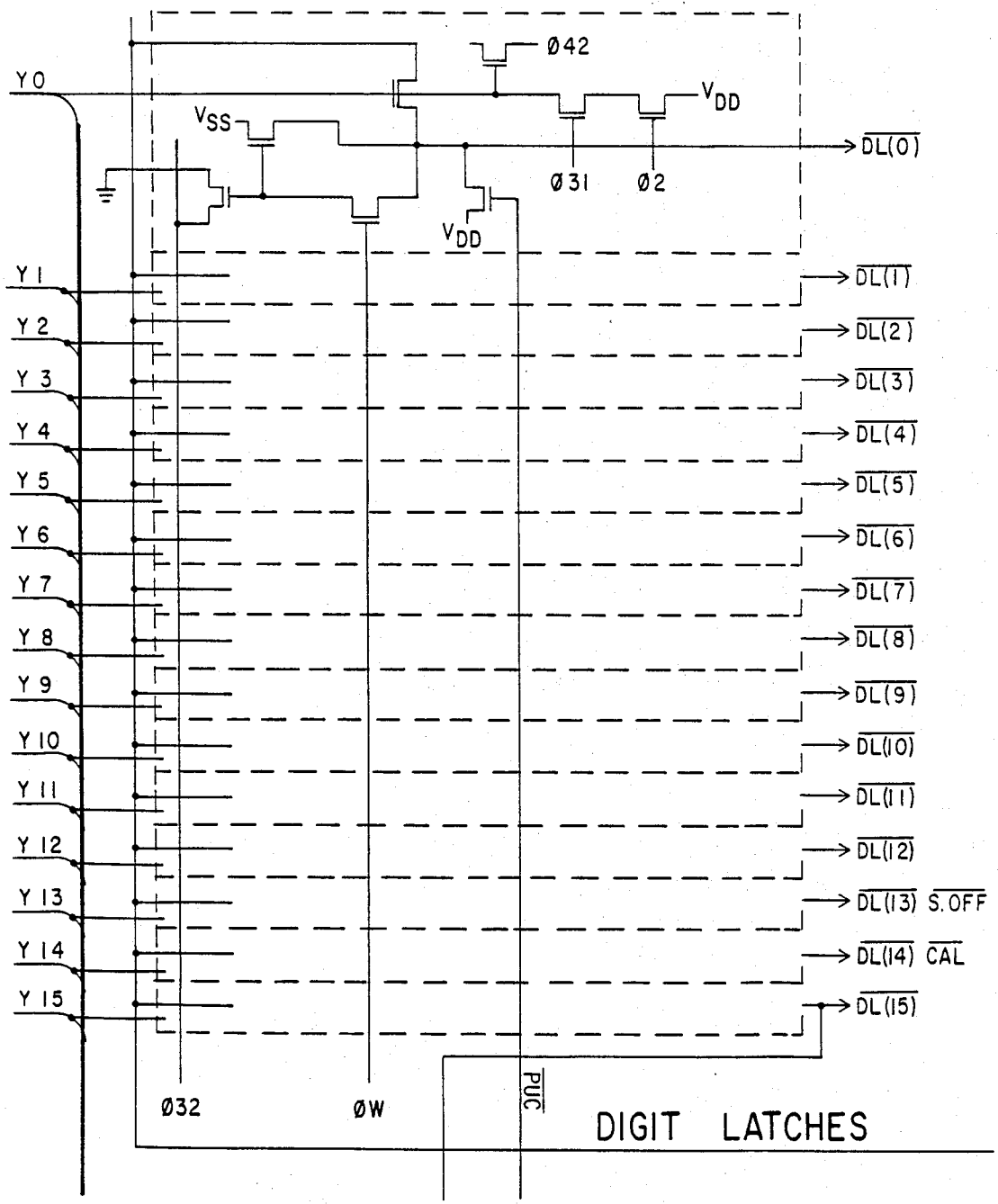
Figure 16:
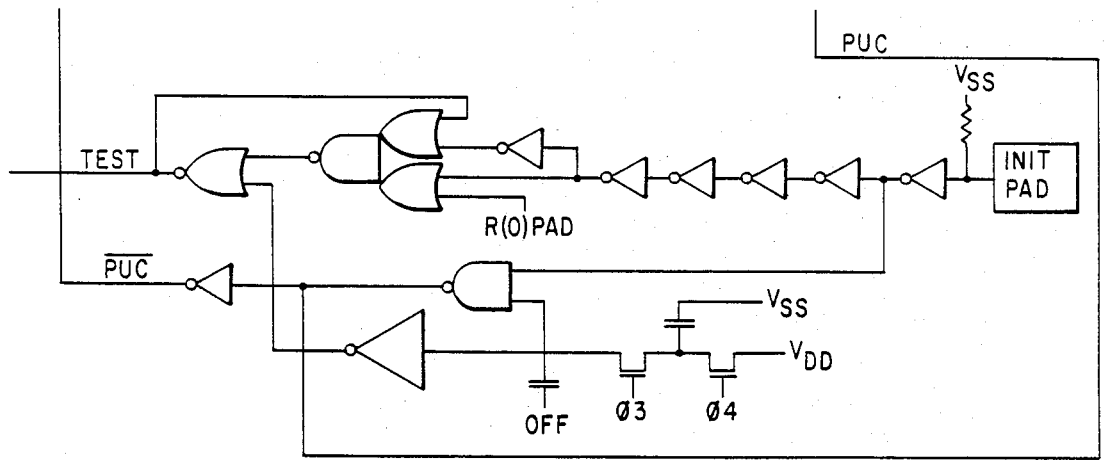
Figure 17:
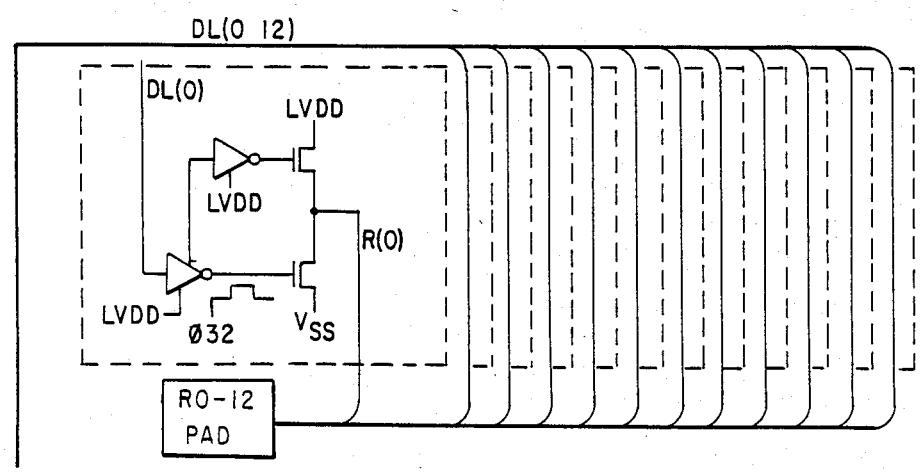
Figure 18:
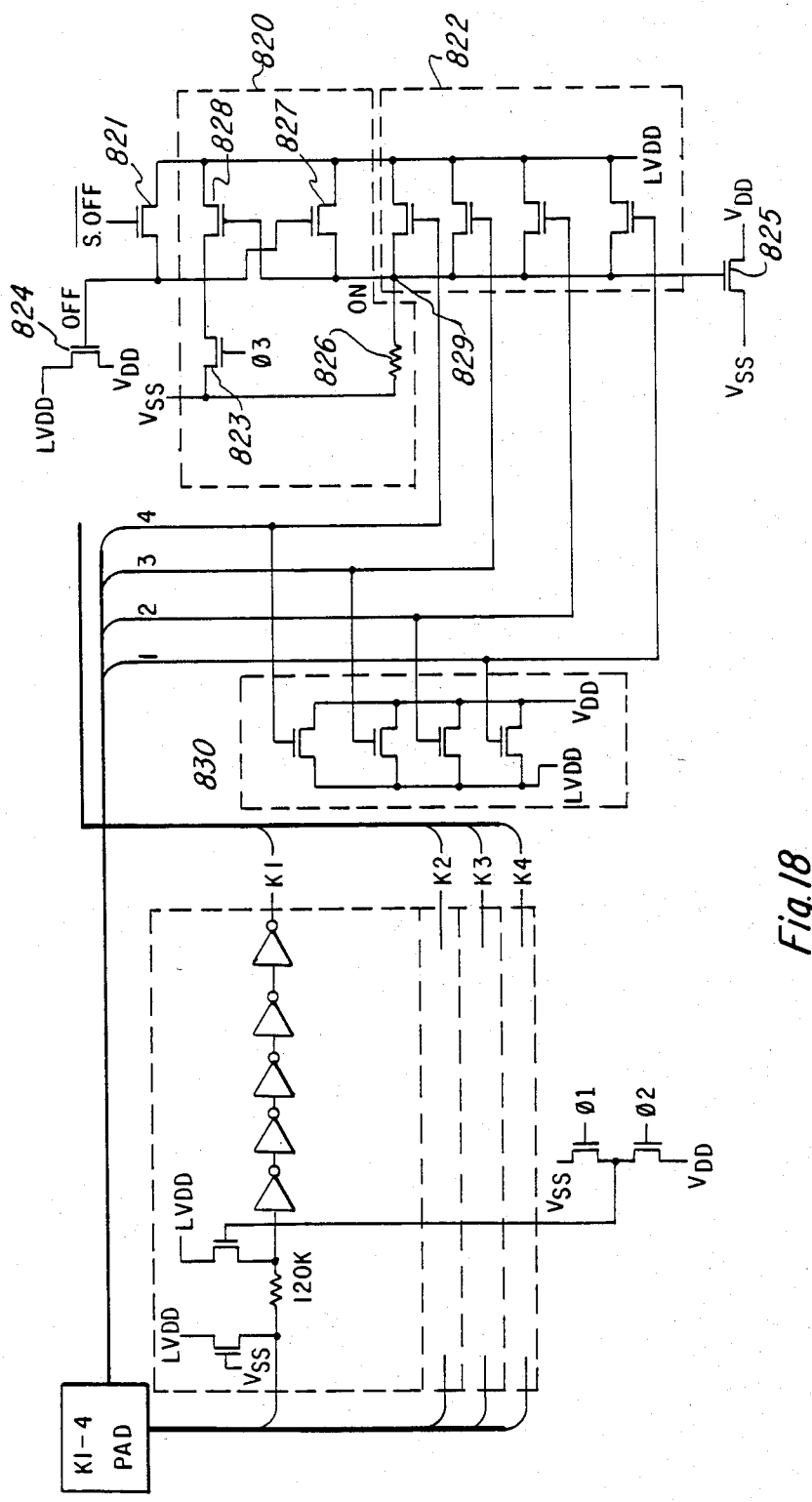
Figure 19A:
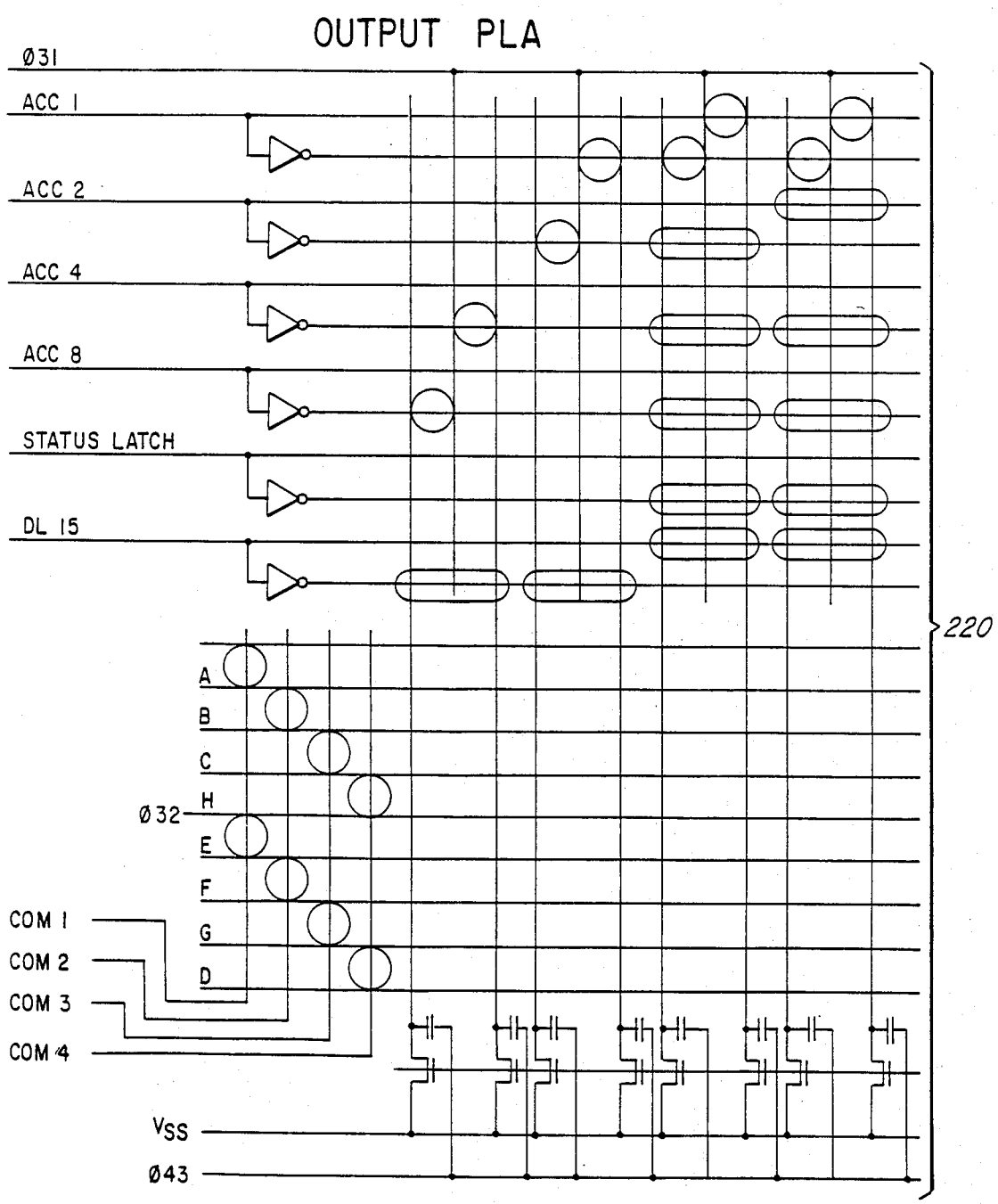
Figure 19B:
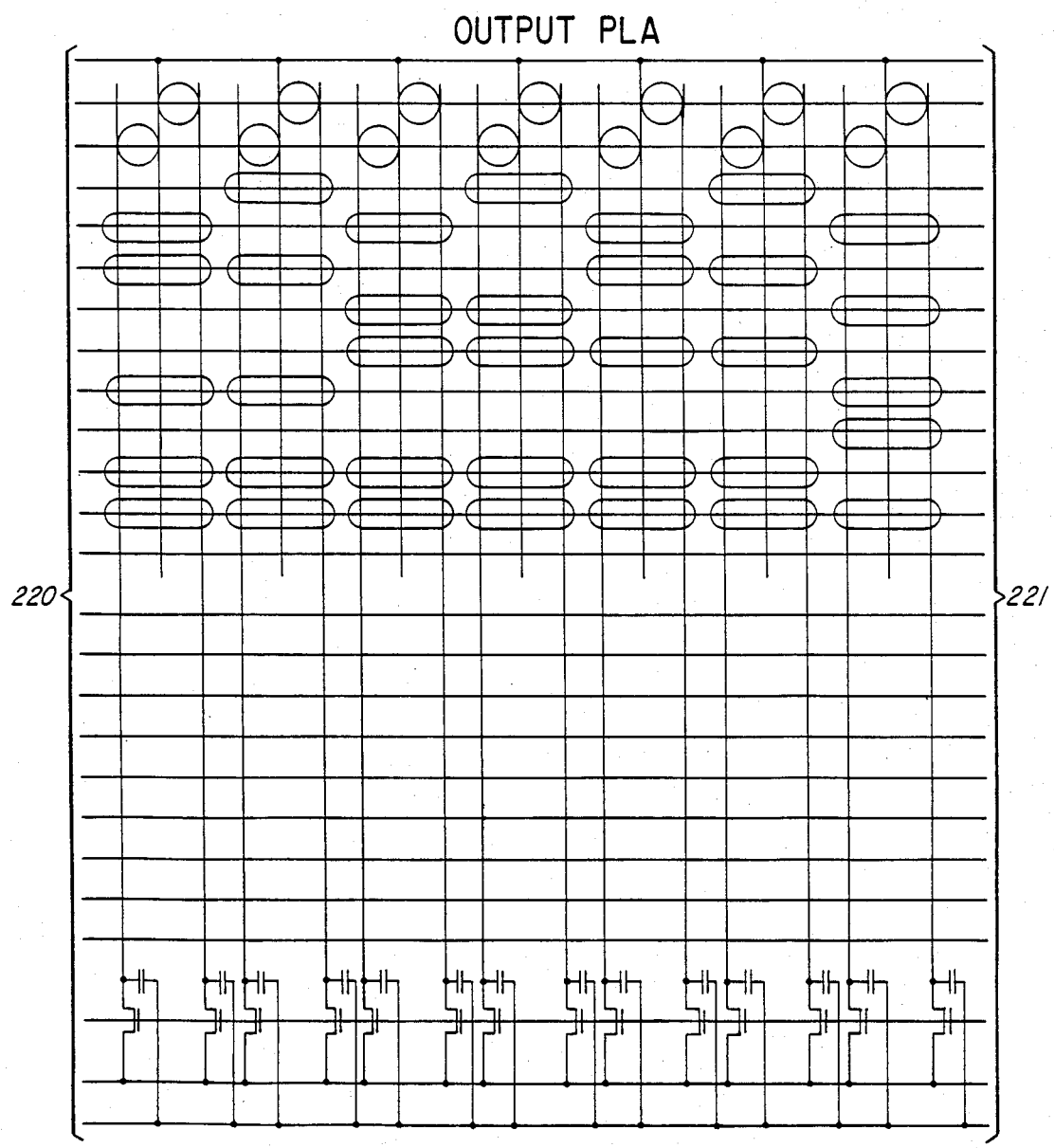
Figure 19C:
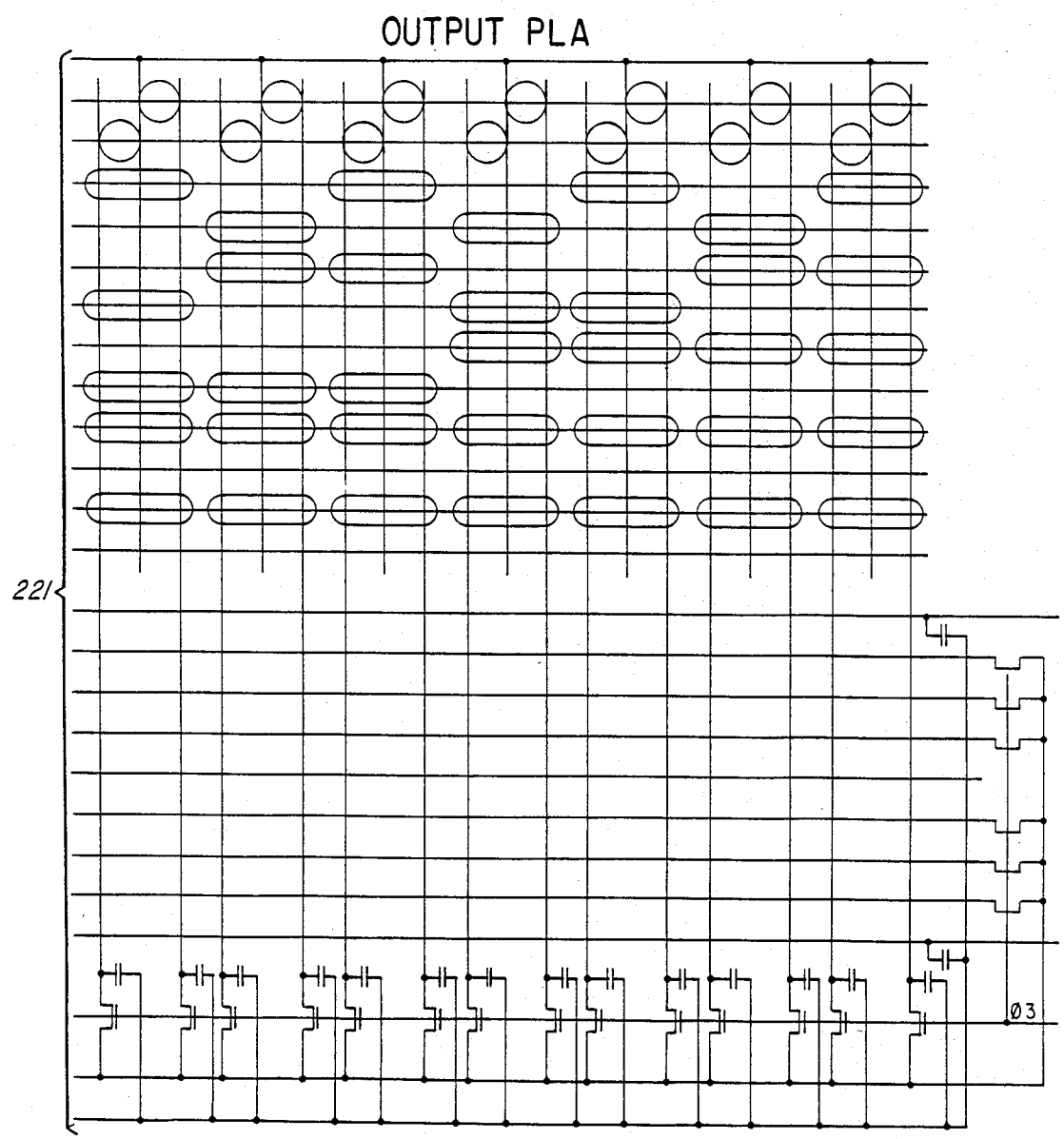
Figure 20:
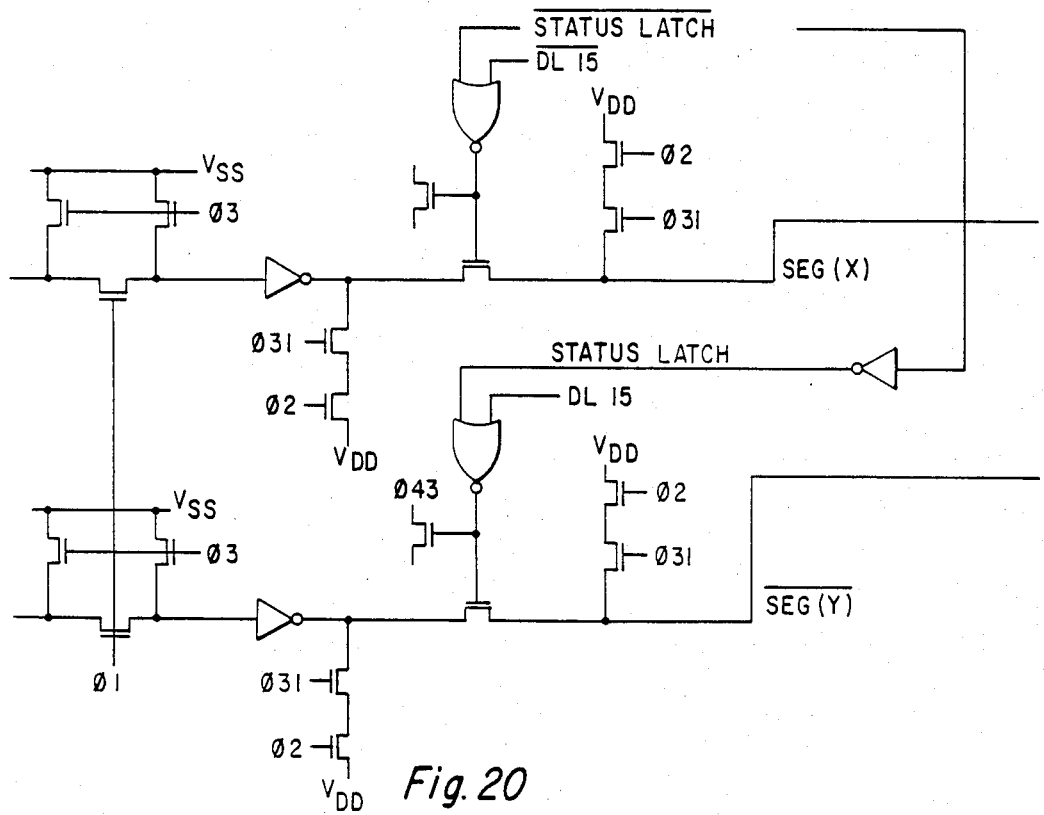
Figure 21:
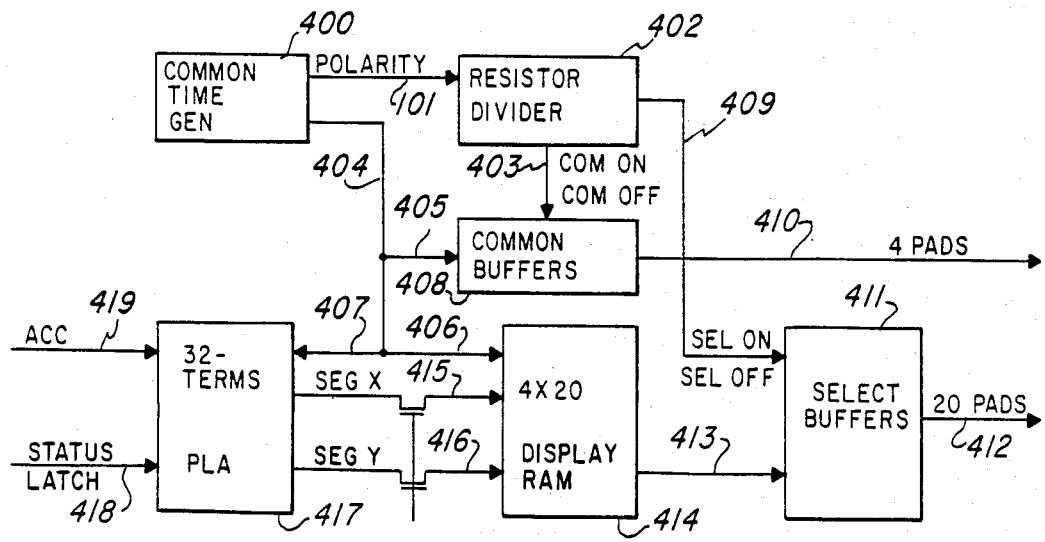
Figure 22A:
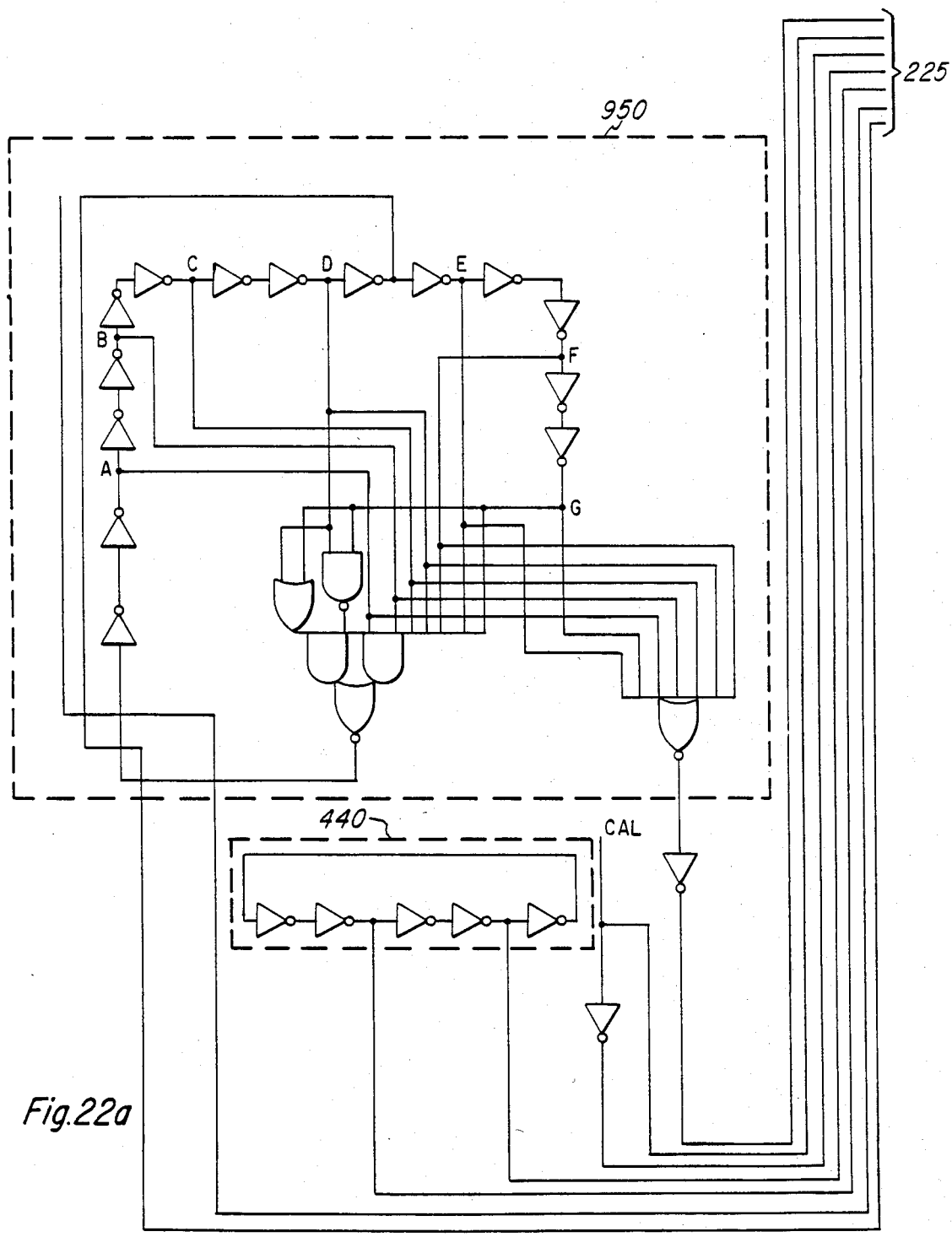
Figure 22B:
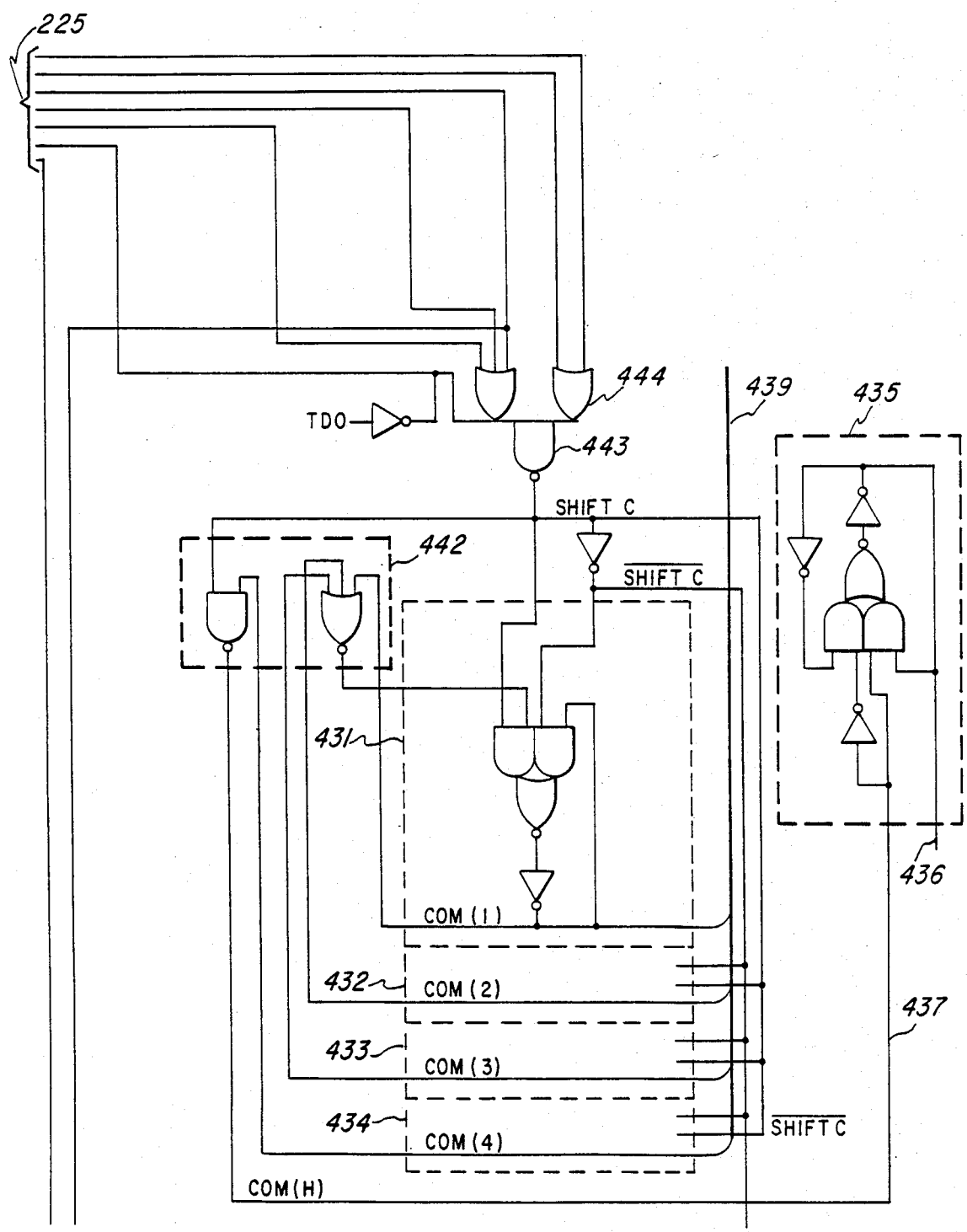
Figure 23A:
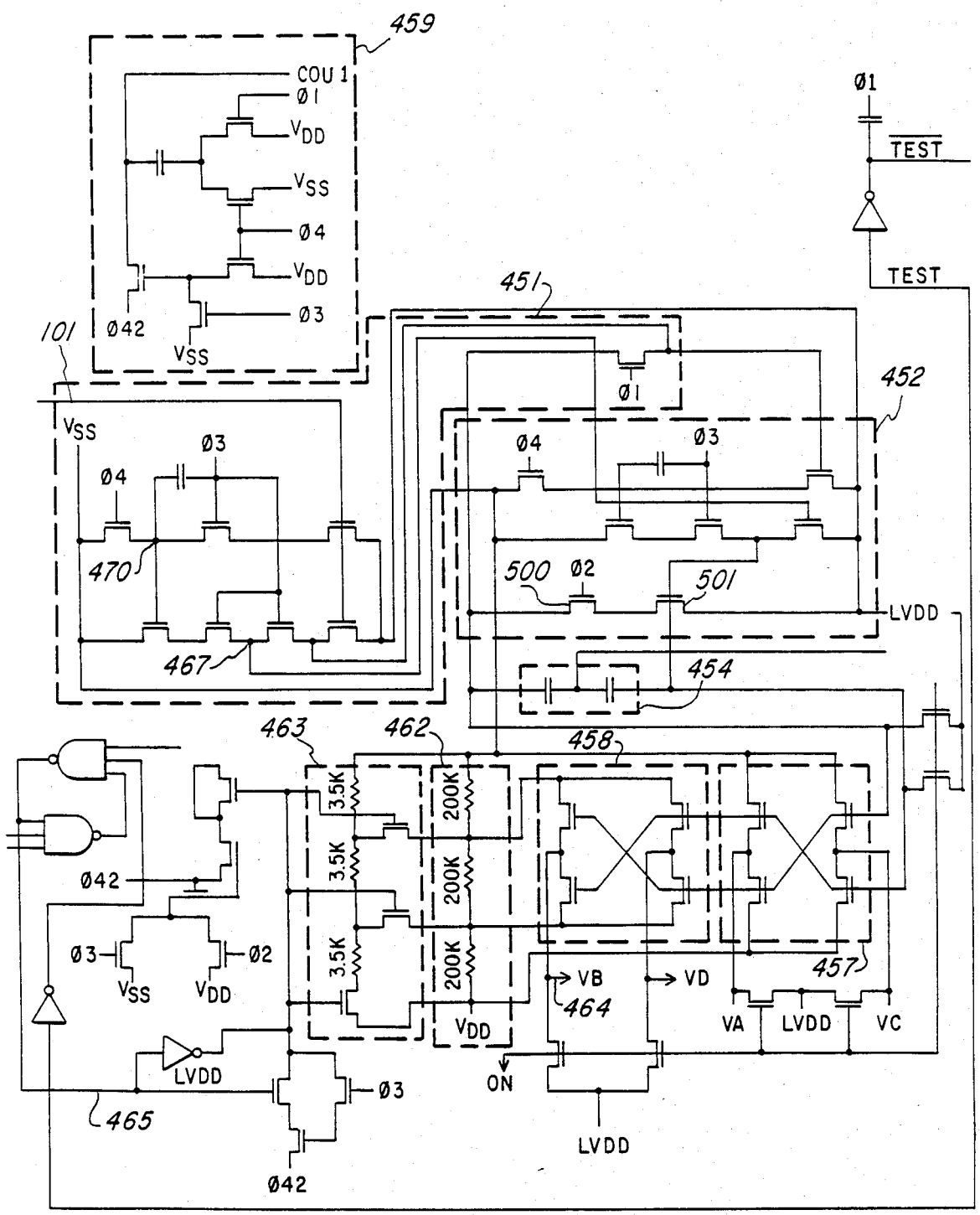
Figure 23B:
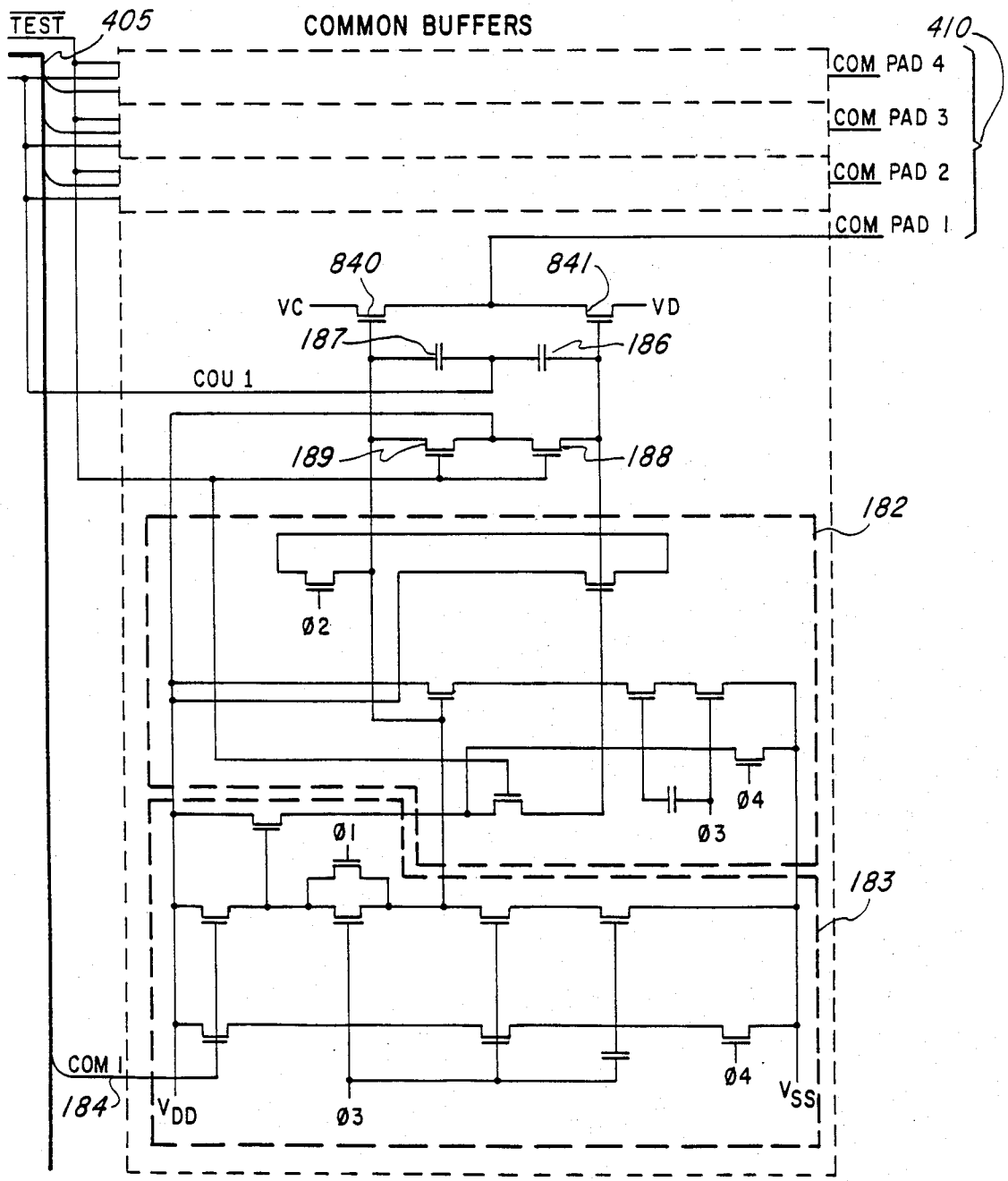
Figure 24A:
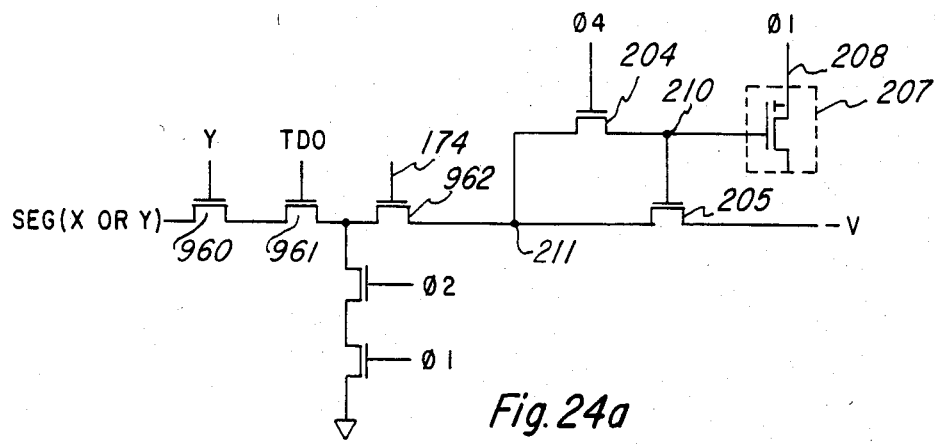
Figure 24B:
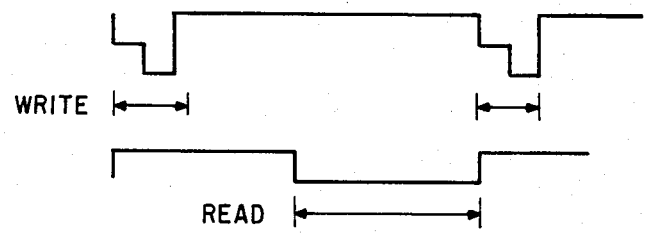
Figure 24D:
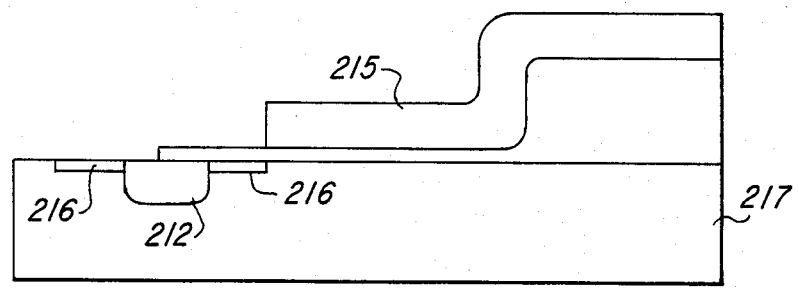
Figure 24C:
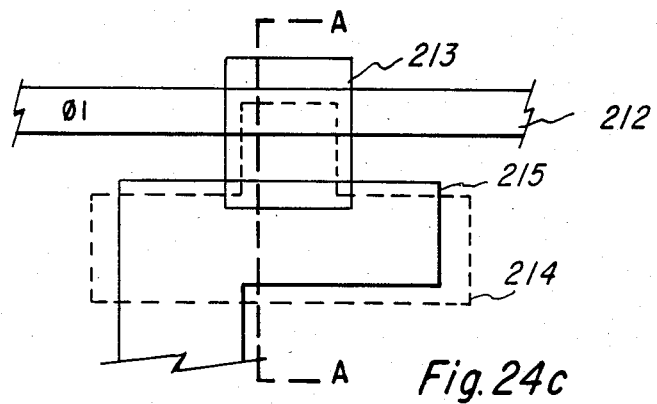
Figure 25A:
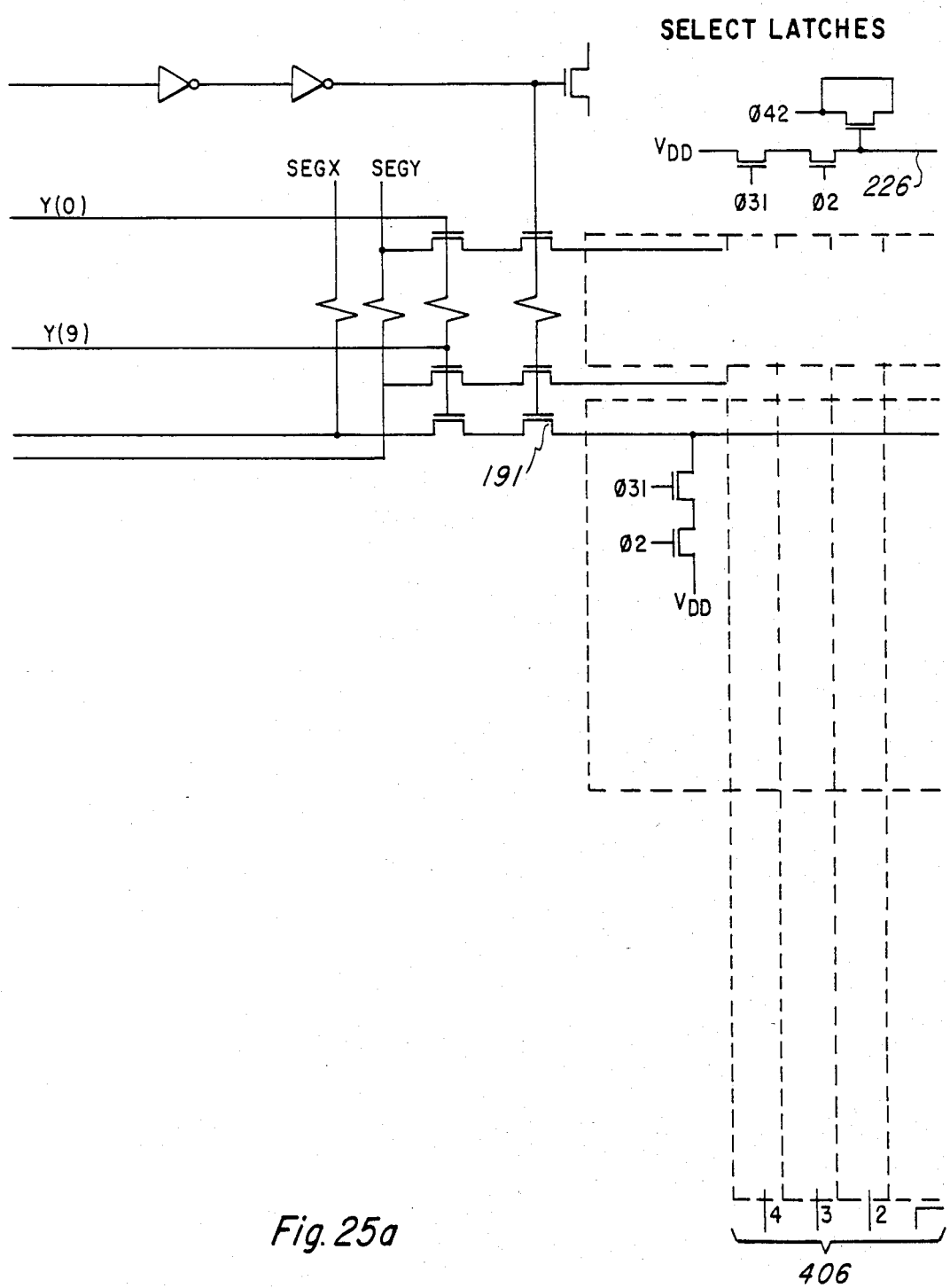
Figure 25B:
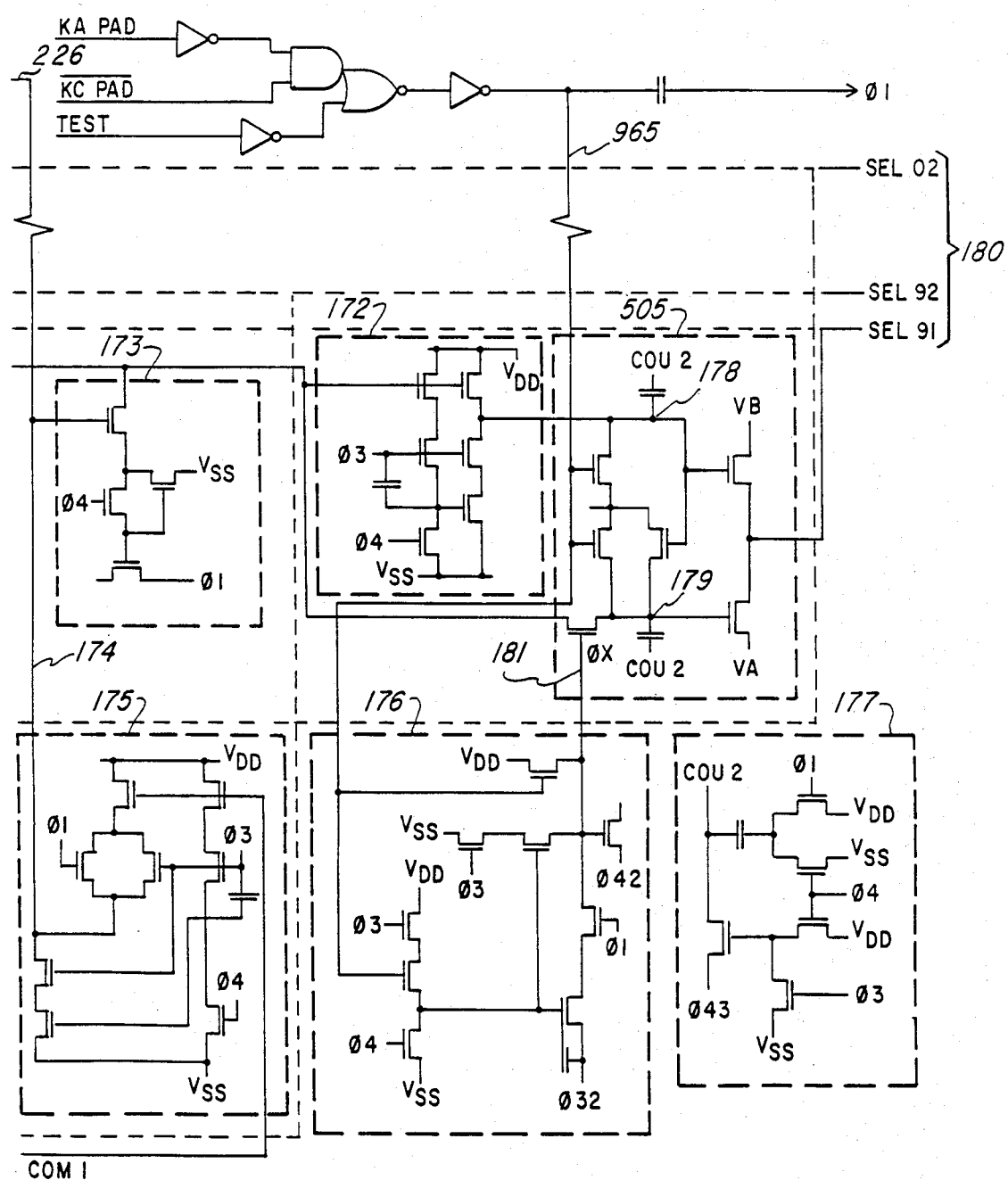
Figure 26:
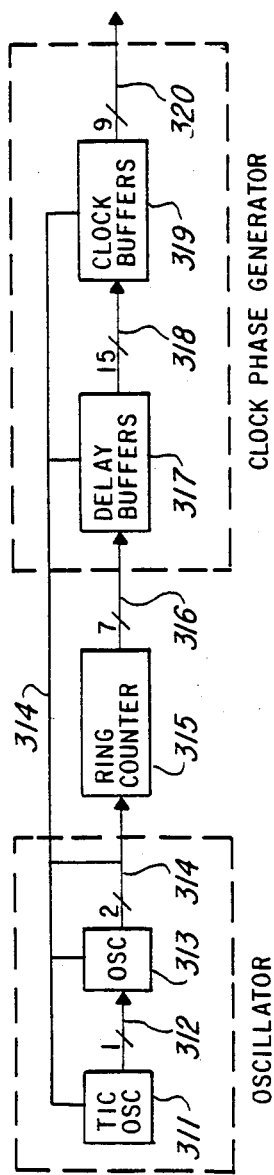
Figure 27:
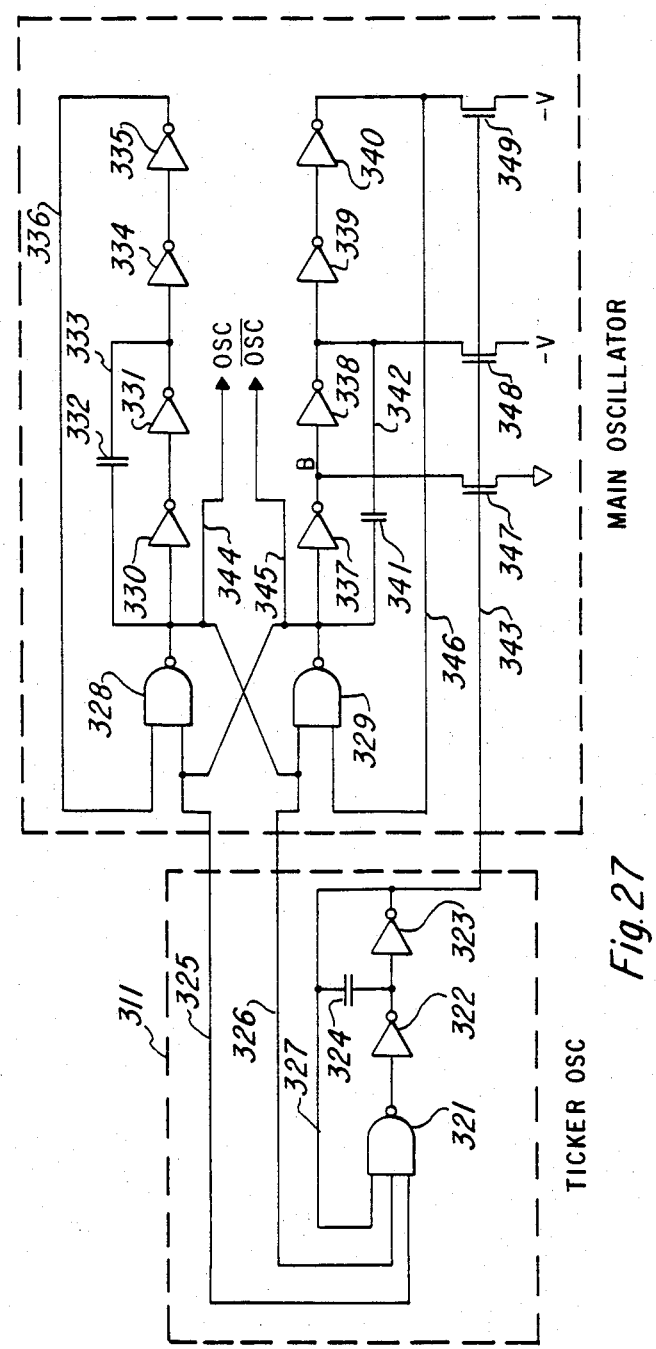
Figure 28A:
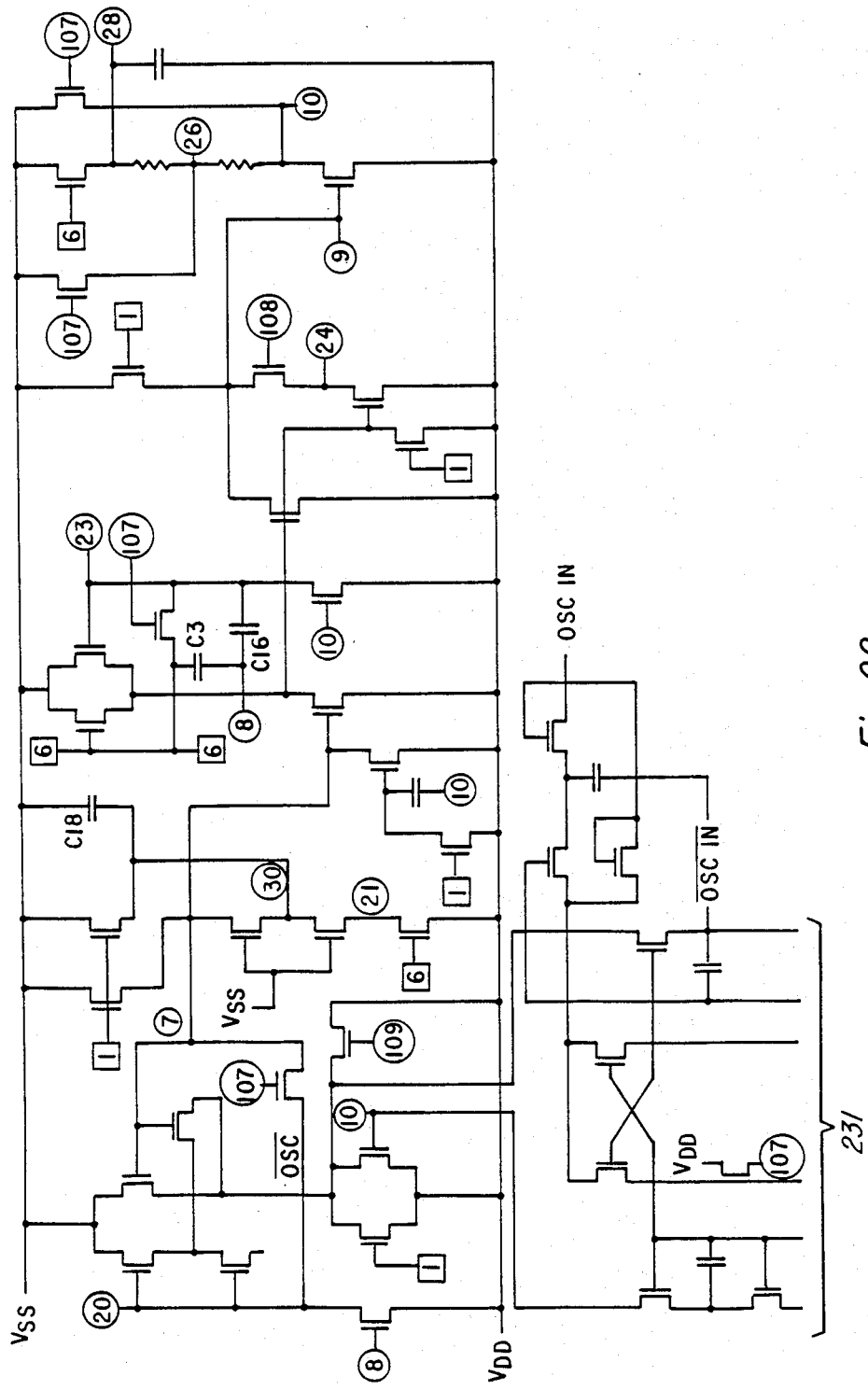
Figure 28B:
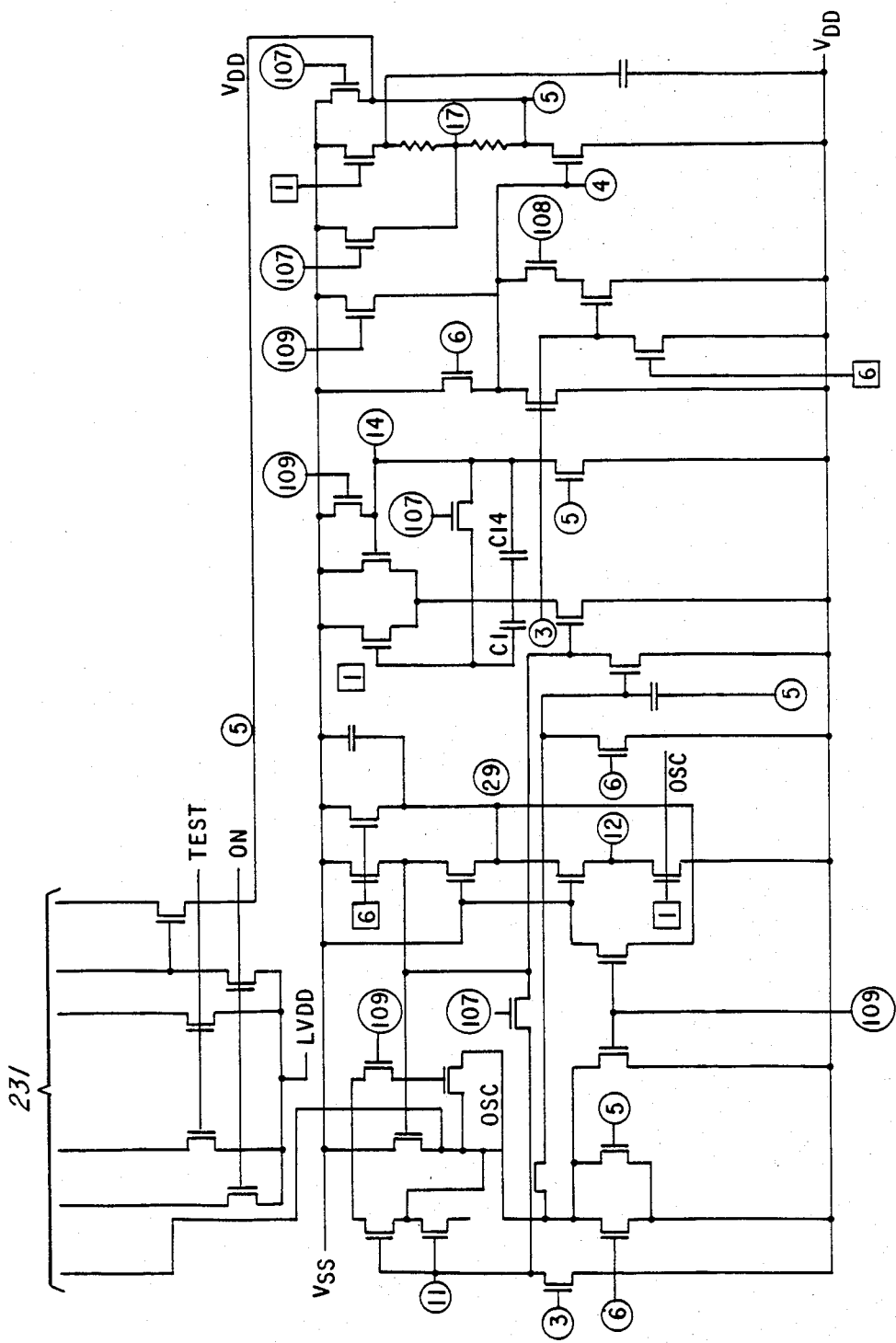
Figure 29A:
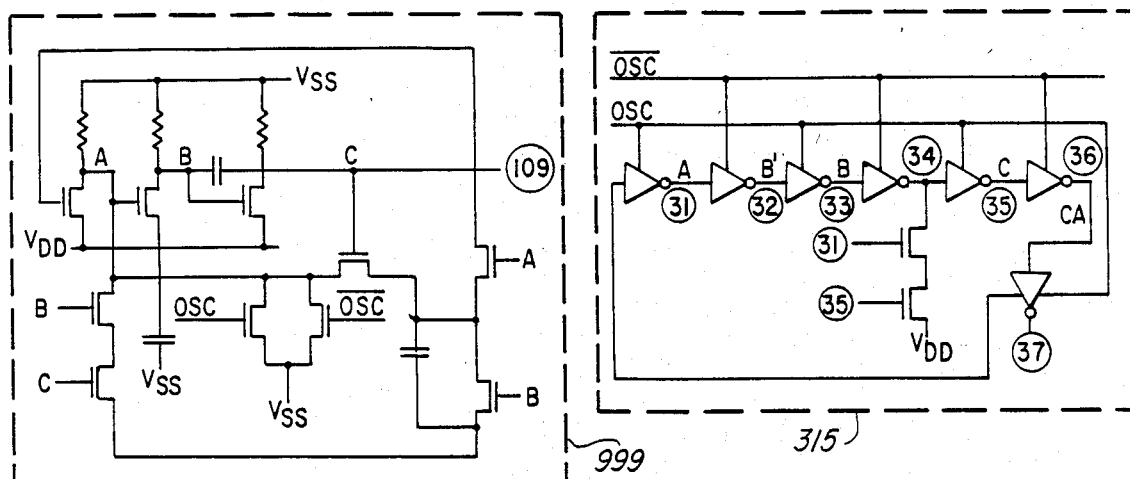
Figure 29A:
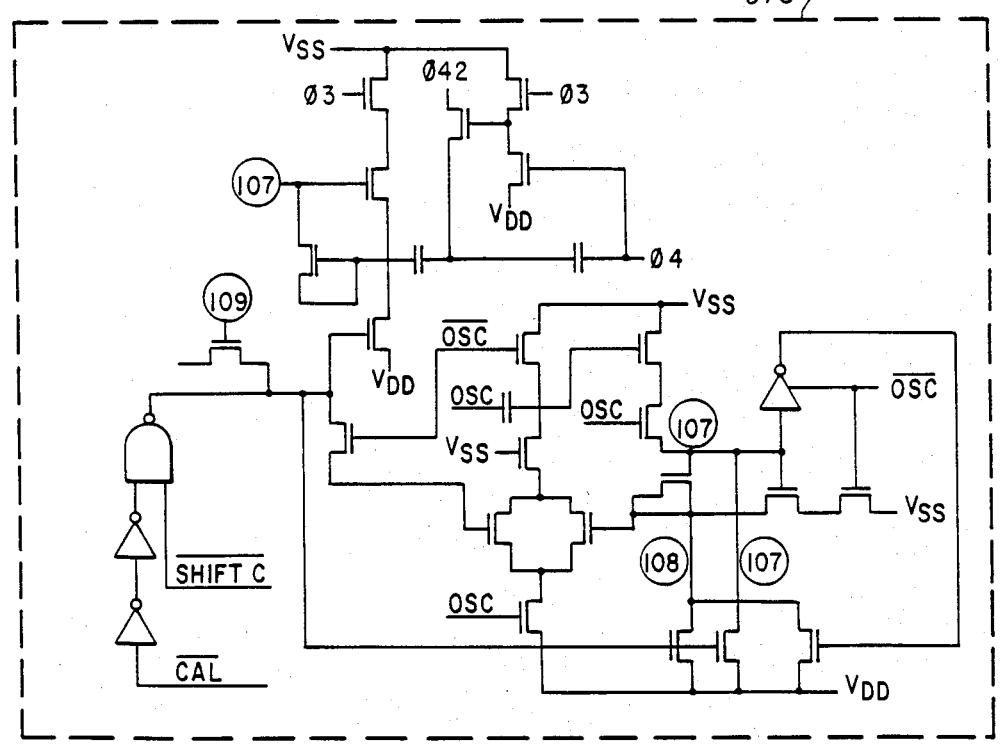
Figure 29A:
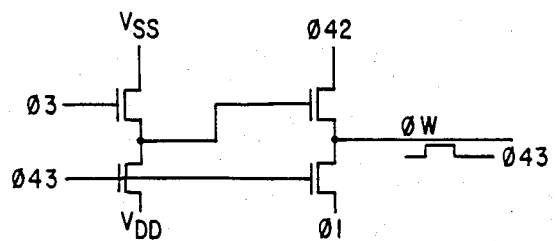
Figure 29B:
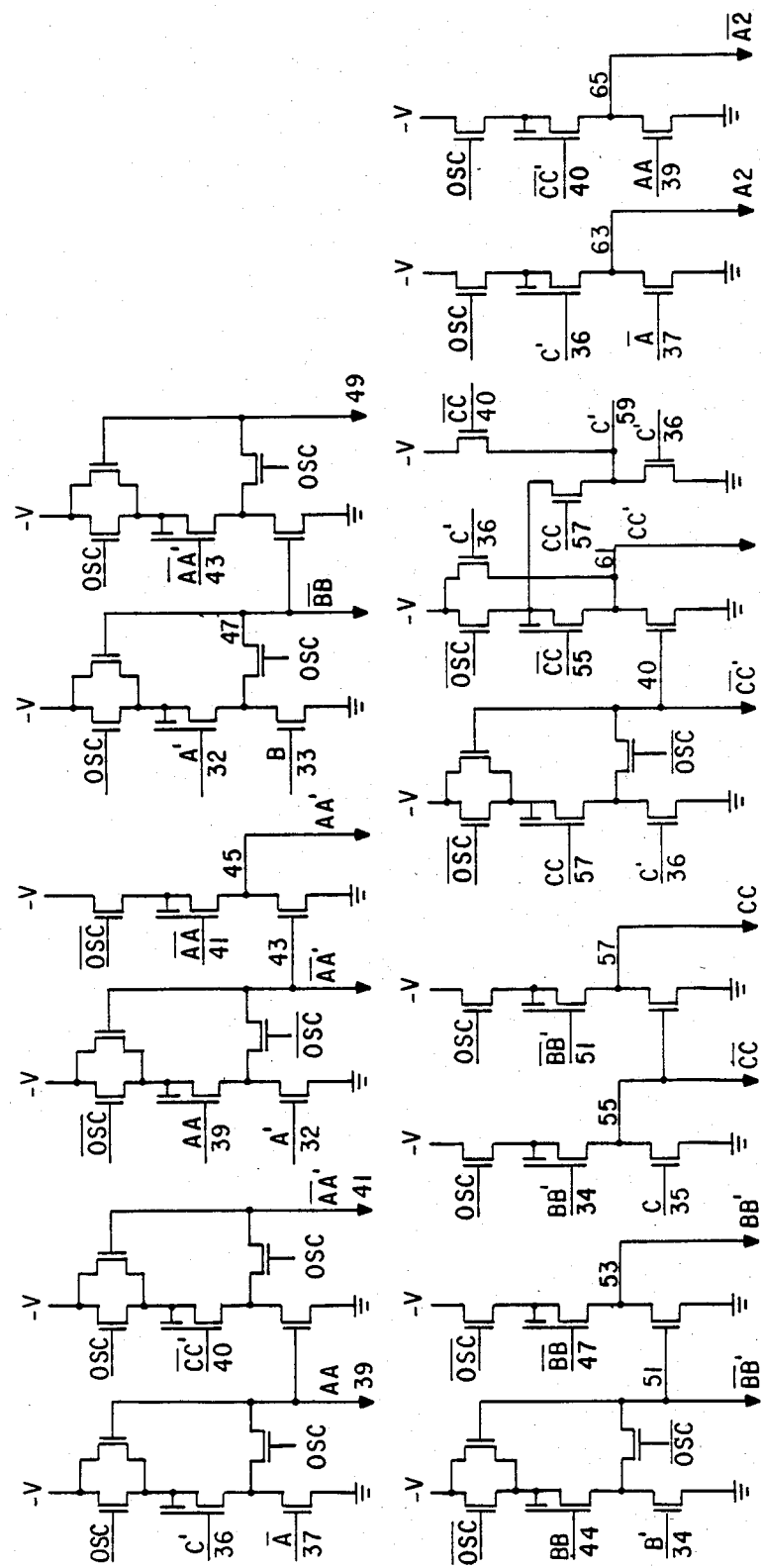
Figure 29C:
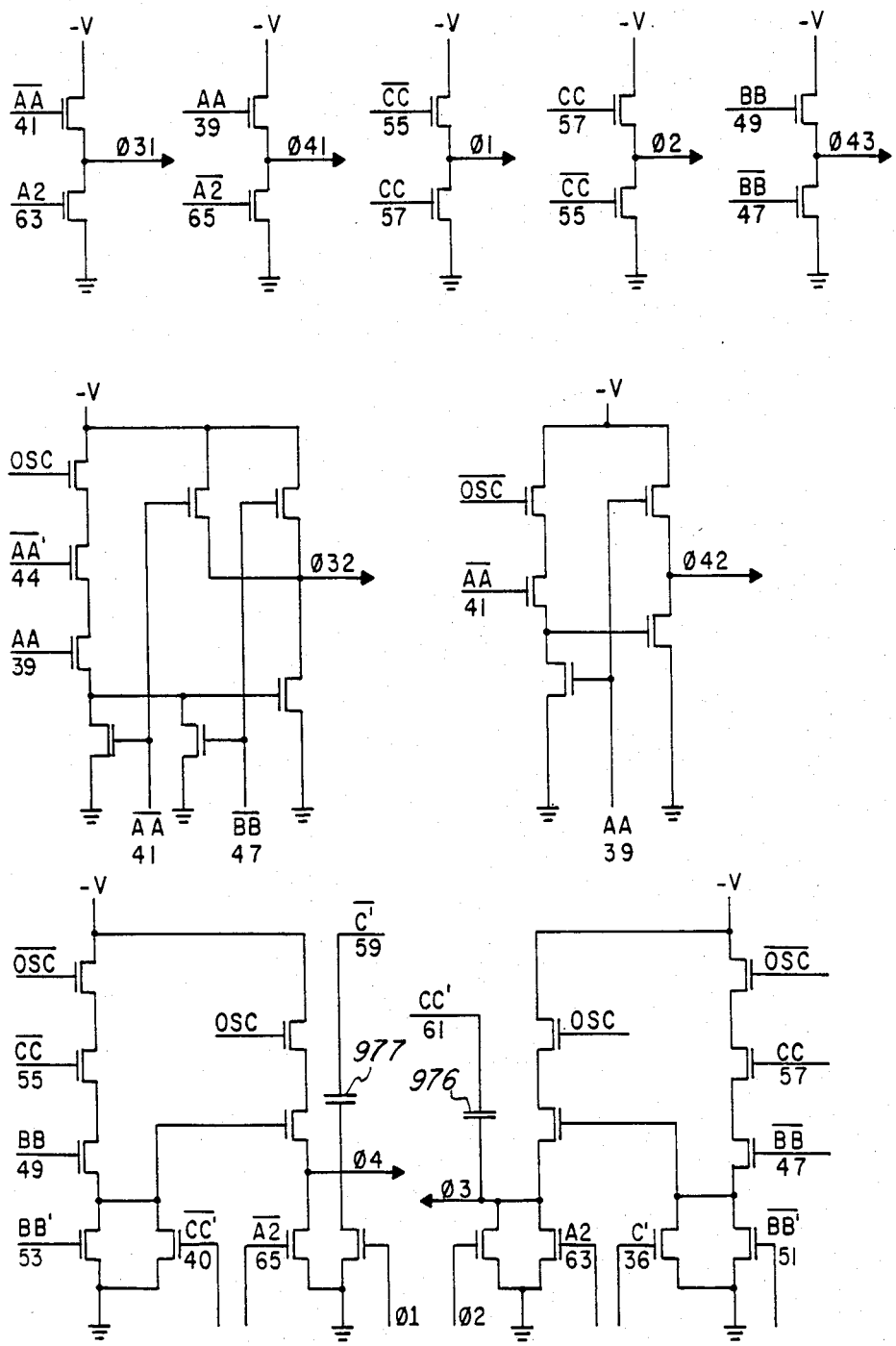
Figure 30:
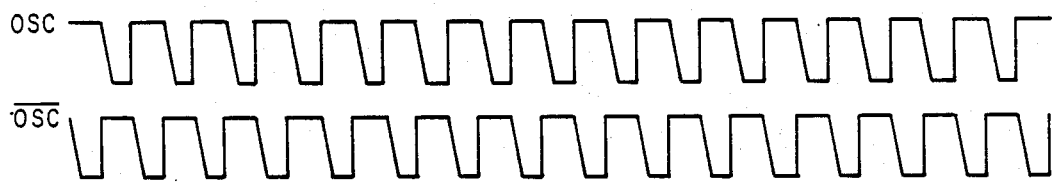
Figure 31:
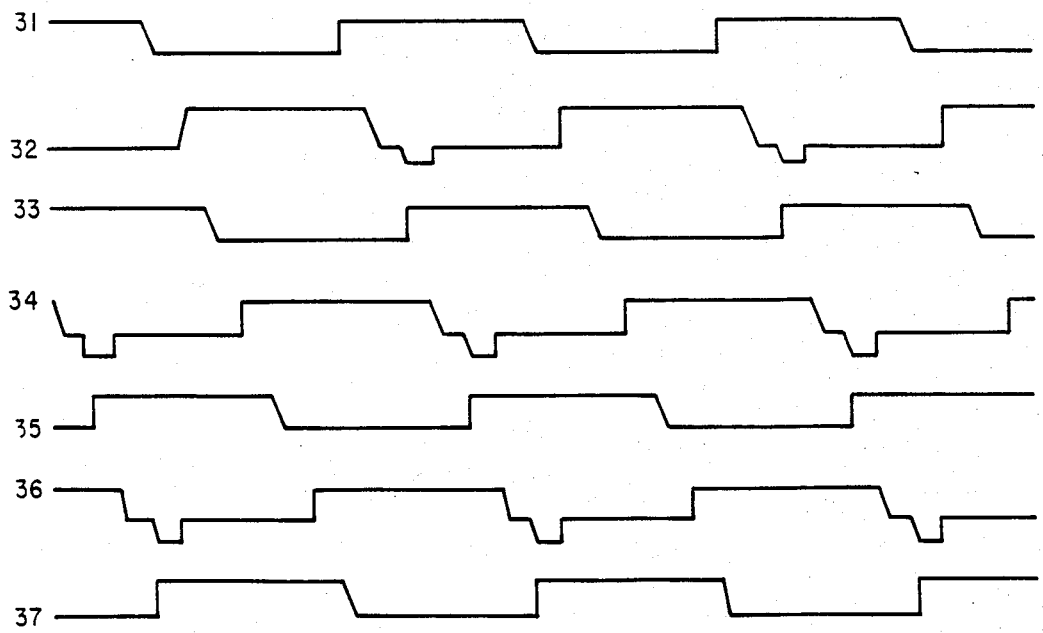
Figure 32:
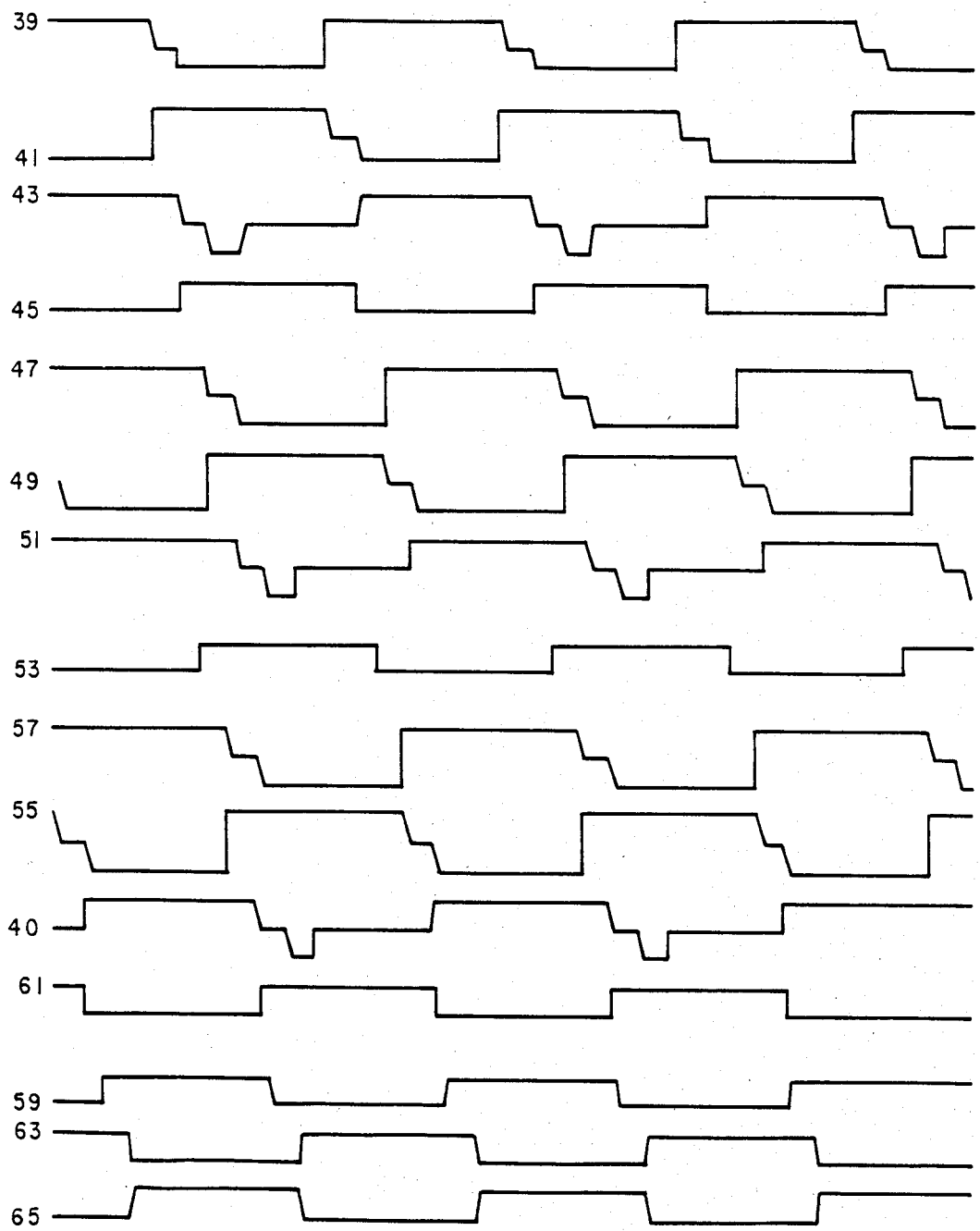
Figure 33:
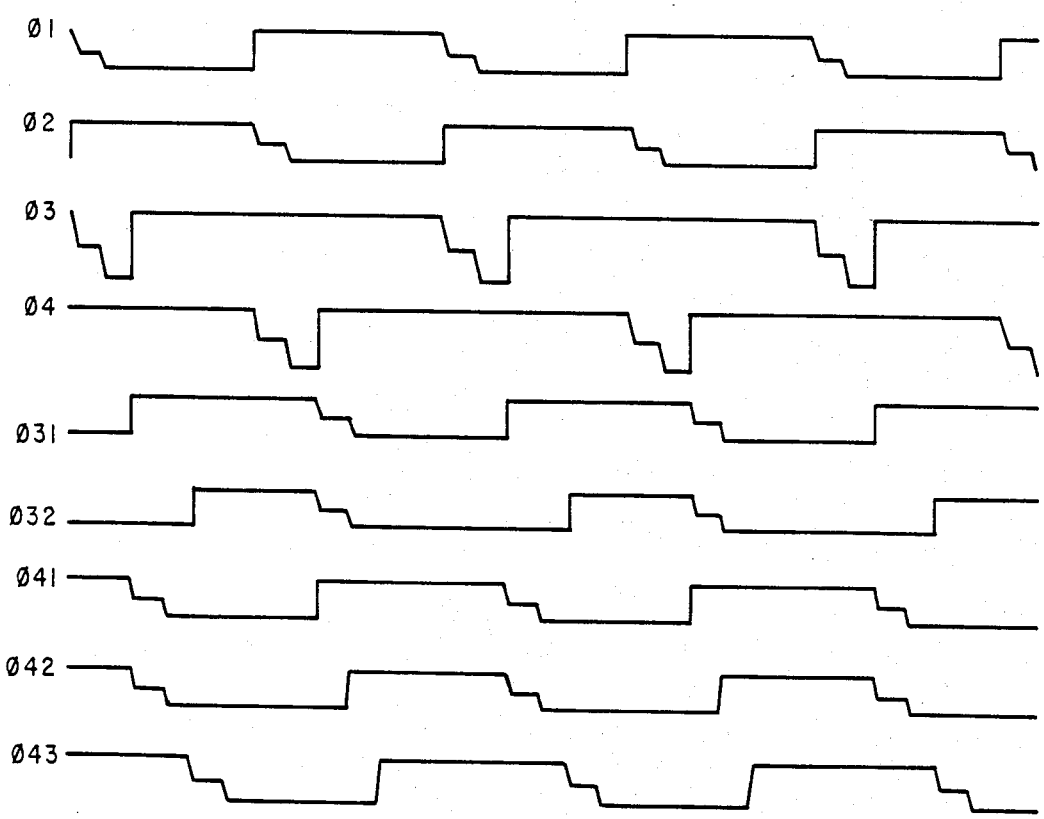
Figure 34:
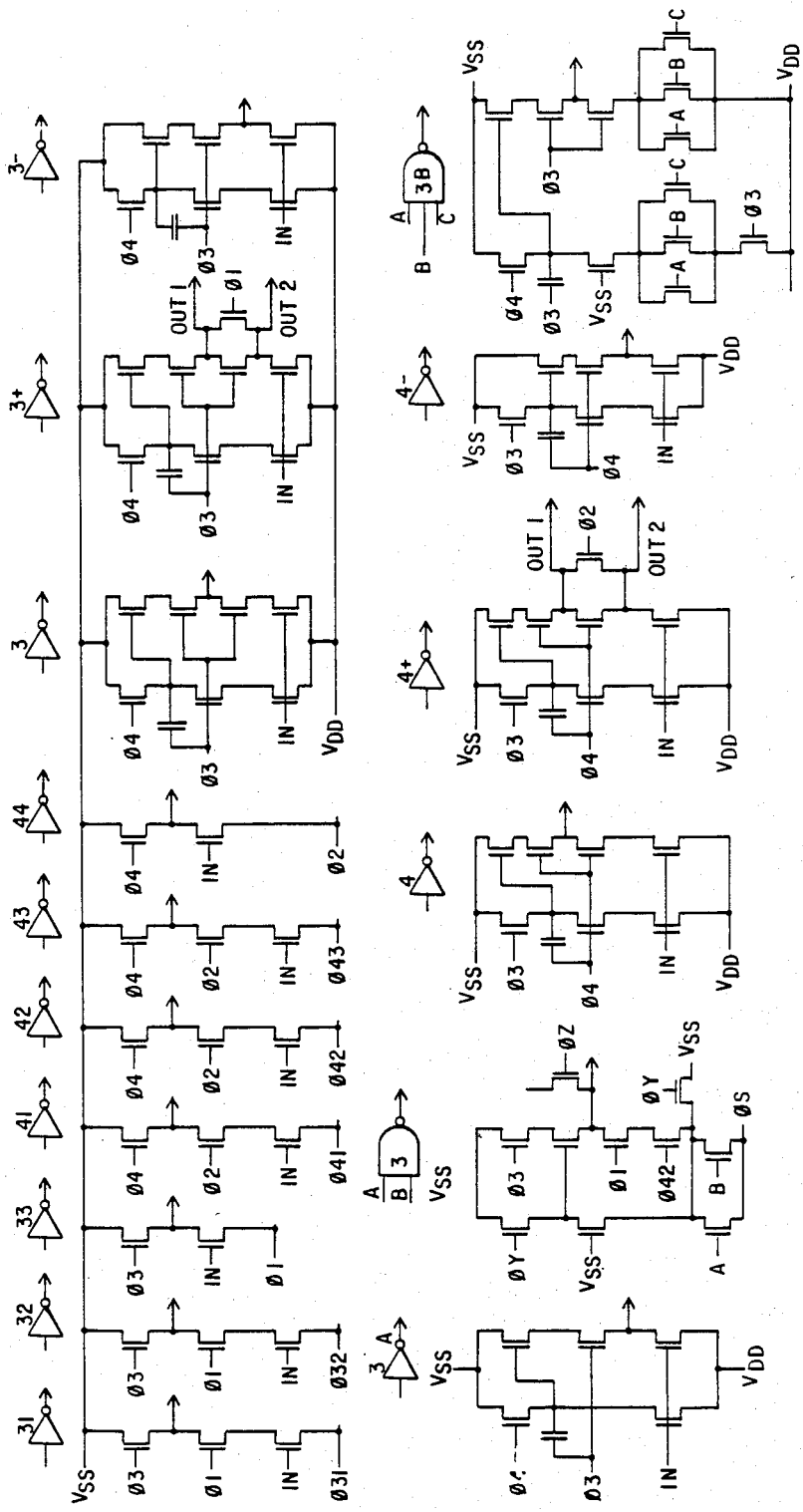

FIG. 5 illustrates the block diagram of the microcomputer circuitry disclosed. It should be noted that this microcomputer circuitry is similiar to that disclosed in U.S. Pat. No. 3,991,305 which is herein incorporated by reference. In addition, this basic type of architecture is also disclosed in U.S. patent Ser. No. 216,113 which is also herein incorporated by reference. Instructions for this microprocessor system are contained in the read only memory (ROM) which are addressed by a chapter register (CA,), page register (PAGE), and program counter (PC). The chapter register and page register both contain a chapter buffer (CB) and page buffer (PB). In addition, there is provided a three level stack for subroutine calls. The output of the ROM is decoded by instruction decoder to provide the control signals for the remainder of the microcomputer circuitry. The timing for the microcomputer circuitry is provided by the oscillator. The input to the device is through the K1 through K4 ports. These inputs are applied to the four bit arithmetic logic unit (ALU). The ALU also receives inputs from a random access memory RAM (a device provided for temporary storage of data). The arithmetic logic unit outputs to a Y register and an accumulator which also may provide inputs back into the arithmetic logic unit. The Y register also outputs to the RAM and to register digit outputs from the microcomputer (R0 through R12). The accumulator provides output to the output programmed logic array (OPLA) which in turn provides data to the display RAM. The display RAM also receives an output from the Y register. The common line generator, display RAM and segment drivers provide outputs to drive LCD devices.

This block diagram (without the LCD interface) is discussed in more detail in the *TMS 1000 Series Data Manual,* dated December 1975, published by Texas Instruments Incorporated, which is herein incorporated by reference. This circuitry is also discussed in the *TMS 1000 Series MOS/LSI One Chip Microcomputers Programmers Reference Manual,* published by Texas instruments Incorporated and herein incorporated by reference.

What we claim is:

1. A low power logic circuit comprising:
 a node;
 a voltage supply for supplying voltage to the low power logic circuit;
 an input line means for receiving an input signal with a first and second logic level;
 an output line;
 a first and second clock means for providing a first and second clock signal, the first clock signal having an antiphase relationship with the second clock signal;
 first circuit means, connected to said first and second clock means and said voltage supply for precharging the node with the supply voltage in response to the first clock signal, and conditionally discharging the node in response to the second clock signal;
 a second circuit means connected to said input line means for discharging said node upon an occurrence of the first logic level and the first circuit means conditioned to discharge said node; and
 third circuit means connected to said second circuit means, said node, said input line means, said second clock means, said power supply and said output line, for isolating said output line from the node, in response to the second clock signal by disabling the third circuit means when the first clock signal enables the first circuit means, the third circuit means includes: switching means, connected to said power supply and said node for providing an output signal to said output line upon an occurrence of a preselected change of level of said node with an occurrence of a preselected clock level of said second clock signal.

2. The low power logic circuit according to claim 1, wherein said first circuit means includes a capacitor connected between the second clock means and the node to provide an additional charge to said node.

3. The low power logic circuit according to claim 1, wherein said first, second and third circuit means comprises:
 field effect transistors.

4. The low power logic circuit according to claim 3, wherein said first, second and third circuit means comprises:
 positive channel metal oxide semiconductor field effect transistors.

5. The low power logic circuit according to claim 4 wherein the first, second and third circuit means comprises:
 a monolithically integrated circuit on a single semiconductor substrate.

* * * * *